(12) United States Patent
Kurjanowicz

(10) Patent No.: US 8,223,526 B2
(45) Date of Patent: Jul. 17, 2012

(54) LOW POWER ANTIFUSE SENSING SCHEME WITH IMPROVED RELIABILITY

(75) Inventor: Wlodek Kurjanowicz, Arnprior (CA)

(73) Assignee: Sidense Corp., Ottawa, Ontario (CA)

( * ) Notice: Subject to any disclaimer, the term of this patent is extended or adjusted under 35 U.S.C. 154(b) by 182 days.

(21) Appl. No.: 12/713,991

(22) Filed: Feb. 26, 2010

(65) Prior Publication Data

US 2010/0220511 A1 Sep. 2, 2010

Related U.S. Application Data

(60) Provisional application No. 61/156,213, filed on Feb. 27, 2009.

(51) Int. Cl.
*G11C 17/00* (2006.01)
(52) U.S. Cl. .......................................... 365/96; 365/203
(58) Field of Classification Search ............ 365/96, 365/203
See application file for complete search history.

(56) References Cited

U.S. PATENT DOCUMENTS

| | | | |
|---|---|---|---|
| 6,667,902 B2 | 12/2003 | Peng | |
| 6,671,040 B2 | 12/2003 | Fong | |
| 6,809,948 B2 * | 10/2004 | Nachumovsky et al. | 365/96 |
| 6,879,525 B2 * | 4/2005 | Van Brocklin et al. | 365/189.09 |
| 7,280,425 B2 * | 10/2007 | Keshavarzi et al. | 365/225.7 |
| 7,402,855 B2 | 7/2008 | Kurjanowicz | |
| 2007/0165441 A1 | 7/2007 | Kurjanowicz et al. | |
| 2007/0257331 A1 | 11/2007 | Kurjanowicz | |
| 2008/0080295 A1 * | 4/2008 | Namekawa et al. | 365/230.06 |
| 2008/0137436 A1 | 6/2008 | Salter et al. | |
| 2009/0154217 A1 | 6/2009 | Kurjanowicz et al. | |

FOREIGN PATENT DOCUMENTS

| | | |
|---|---|---|
| WO | 2008077237 A1 | 7/2008 |
| WO | 2008080213 A1 | 7/2008 |

OTHER PUBLICATIONS

Canadian Patent Application Serial No. 2,692,887—Office Action dated Jun. 8, 2010.
International Application No. PCT/CA2010/000249, International Search Report dated May 4, 2010.

\* cited by examiner

*Primary Examiner* — Son Dinh
*Assistant Examiner* — Nam Nguyen
(74) *Attorney, Agent, or Firm* — Shin Hung; Borden Ladner Gervais LLP

(57) ABSTRACT

Generally, a method and circuit for improving the retention and reliability of unprogrammed anti-fuse memory cells. This is achieved by minimizing the tunneling current through the unprogrammed anti-fuse memory cells which can cause eventual gate oxide breakdown. The amount of time a read voltage is applied to the anti-fuse memory cells is reduced by pulsing a read voltage applied to a wordline connected to the unprogrammed anti-fuse memory cells, thereby reducing the tunneling current. Further tunneling current can be reduced by decoupling the unprogrammed anti-fuse memory cells from a sense amplifier that can drive the corresponding bitline to VSS.

26 Claims, 16 Drawing Sheets

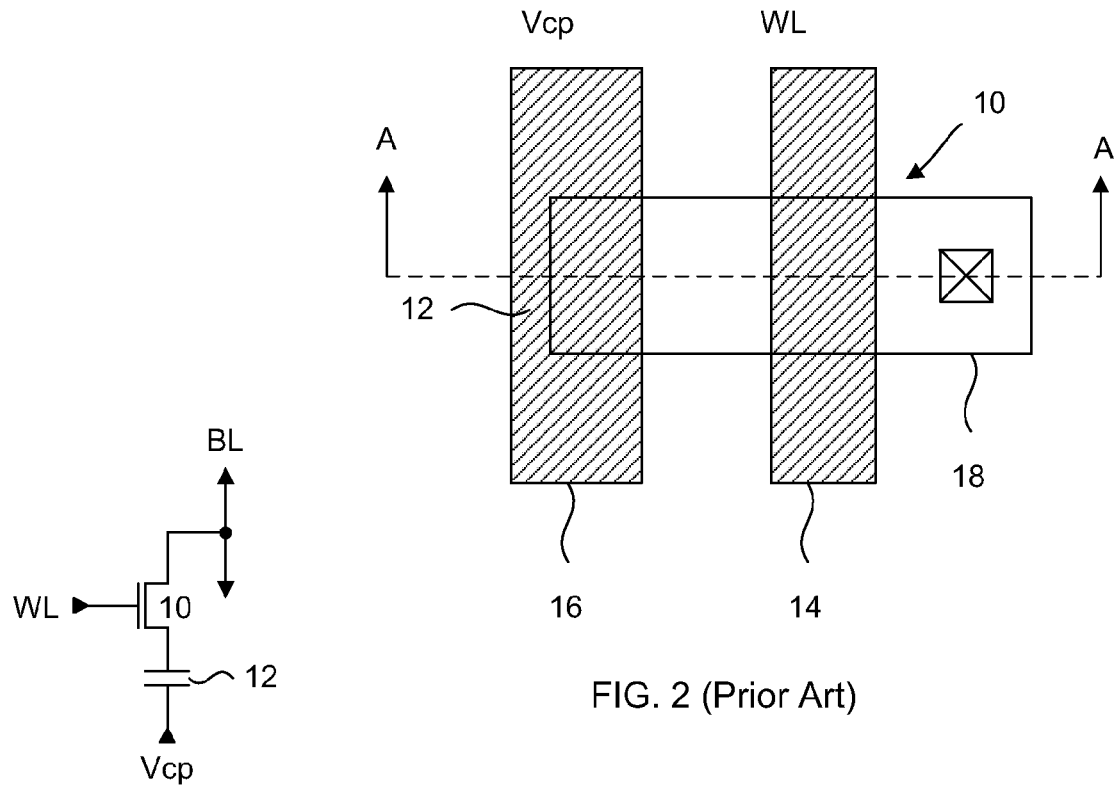
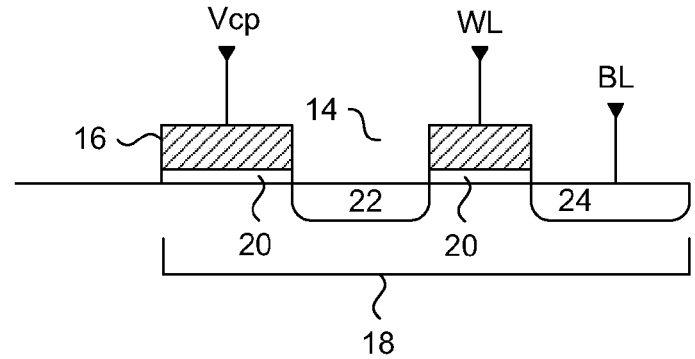
FIG. 1 (Prior Art)
FIG. 2 (Prior Art)
FIG. 3 (Prior Art)

LOW POWER ANTIFUSE SENSING SCHEME WITH IMPROVED RELIABILITY

CROSS REFERENCE TO RELATED APPLICATIONS

This application claims the benefit of priority of U.S. Provisional Patent Application No. 61/156,213 filed Feb. 27, 2009, which is incorporated herein by reference in its entirety.

FIELD OF THE INVENTION

The present invention relates generally to one time programmable (OTP) memory. More particularly, the present invention relates to reliability of unprogrammed one time programmable memory cells.

BACKGROUND OF THE INVENTION

Over the past 30 years, anti-fuse technology has attracted significant attention of many inventors, IC designers and manufacturers. An anti-fuse is a structure alterable to a conductive state, or in other words, an electronic device that changes state from not conducting to conducting. Equivalently, the binary states can be either one of high resistance and low resistance in response to electric stress, such as a programming voltage or current. There have been many attempts to develop and apply anti-fuses in the microelectronic industry, where many anti-fuse applications to date can be seen in FGPA devices manufactured by Actel and Quicklogic, and redundancy or option programming used in DRAM devices by Micron.

An anti-fuse memory is one type of one-time programmable (OTP) memory in which the device can be permanently programmed (electrically) with data once. This data is programmed by an end user for a particular application. There are several types of OTP memory cells which can be used. OTP memories provide users with a level flexibility since any data can be programmed.

Because of its low manufacturing cost, anti-fuse memory can be utilized in all one-time programmable applications, from low cost RF-ID (radio frequency identification) tag applications to automotive and security applications. RF-ID tagging applications are gaining more acceptance in the industry, particularly in sales, security, transport, logistics, and military applications for example. The simplicity and full CMOS compatibility anti-fuse memory allows for application of the RF-ID tag concept to integrated circuit manufacturing and testing processes. Therefore, IC manufacturing productivity can be increased by utilizing anti-fuse memory in combination with an RF communication interface on every wafer and/or every die on the wafer allowing for contact-less programming and reading chip specific or wafer specific information during IC manufacturing and packaging, as well as during printed circuit board assembly.

FIG. 1 is a circuit diagram of a known anti-fuse memory cell, while FIGS. 2 and 3 show the planar and cross-sectional views respectively of the anti-fuse memory cell shown in FIG. 1. The anti-fuse memory cell of FIG. 1 includes a pass, or access transistor 10 for coupling a bitline BL to a bottom plate of anti-fuse device 12. Anti-fuse device 12 is considered a gate dielectric breakdown based anti-fuse device. A wordline WL is coupled to the gate of access transistor 10 to turn it on, and a cell plate voltage Vcp is coupled to the top plate of anti-fuse device 12 for programming anti-fuse device 12.

It can be seen from FIGS. 2 and 3 that the layout of access transistor 10 and anti-fuse device 12 is very straight-forward and simple. The gate 14 of access transistor 10 and the top plate 16 of anti-fuse device 12 are constructed with the same layer of polysilicon, which extend across active area 18. In the active area 18 underneath each polysilicon layer, is formed a thin gate oxide 20, also known as a gate dielectric, for electrically isolating the polysilicon from the active area underneath. On either side of gate 14 are diffusion regions 22 and 24, where diffusion region 24 is coupled to a bitline. Although not shown, those of skill in the art will understand that standard CMOS processing, such as sidewall spacer formation, lightly doped diffusions (LDD) and diffusion and gate silicidation, can be applied. While the classical single transistor and capacitor cell configuration is widely used, a transistor-only anti-fuse cell is further desirable due to the semiconductor array area savings that can be obtained for high-density applications. Such transistor-only anti-fuses should be reliable while simple to manufacture with a low cost CMOS process.

The anti-fuse memory cell of FIGS. 1 to 3 can be programmed by biasing the bitline BL and Vcp to voltage levels that result in an electrical field being formed across the thin gate oxide 20. The access transistor is turned on by driving wordline WL to a positive voltage level. This electrical field should be high enough such that a conductive link is formed in the thin gate oxide 20, thereby effectively electrically coupling top plate 16 to the active area under thin gate oxide 20. Therefore, the presence or absence of such a conductive link can represent logic 0 or 1 levels. To read the cell, Vcp is driven to a positive read voltage, and if a conductive link is present, the bitline BL will receive a current or charge from Vcp via the conductive link. It is assumed that WL is driven to a positive voltage during the read operation. This current or charge can be sensed to provide an indication of the logic state stored by the anti-fuse memory cell.

Ideally, an unprogrammed memory cell, or a memory cell that is not intended to be programmed, behaves like an open circuit when the conductive link is absent. Unfortunately defects in the gate oxide, such as thin gate oxide 20 for example, can occur during semiconductor manufacturing and allow tunneling current to flow through these defects during read operations. This tunneling current is exponentially dependent on the voltage applied by Vcp, and more significantly, the impact of the tunneling current on thin gate oxide 20 is cumulative. More specifically, the current flowing through the defects becomes greater with time, eventually causing the thin gate oxide 20 to break down. The gate oxide breakdown occurs when a critical amount of an electrical charge is passed through the thin gate oxide 20. Theoretically, the total charge accumulated in the gate oxide, referred to as $Q_B$, is equal to a value of the tunneling current referred to as $i_{tunnel}$, multiplied by the access time referred to as $t_{ACC}$, and the number of cycles N where N is an integer number. If the total charge, $Q_{BD}$, passed though the gate oxide exceeds a critical value, the gate oxide breakdown begins to take place.

Therefore, it is possible that anti-fuse memory cells that were not programmed eventually develop gate oxide breakdown during normal use. This means that the data provided by such a memory cell is incorrect since it was intended to be an unprogrammed cell which now behaves as a programmed cell. Accordingly, it is desirable to provide a technique for retaining the unprogrammed state of anti-fuse memory cells.

Even before delivery to end users, the manufacturer of the memory may encounter defects that render the memory device useless because too many cells cannot be used. This will reduce manufacturing yield, and increase costs. Therefore, there is a need to improve the reliability of anti-fuse memories.

SUMMARY OF THE INVENTION

It is an object of the present invention to obviate or mitigate at least one disadvantage of previous anti-fuse memories. In particular, it is an object of the present invention to reduce oxide breakdown in anti-fuse memories.

In a first aspect, there is provided a method for reading programmed and unprogrammed anti-fuse memory cells. The method includes driving a selected wordline, charging a bitline, decoupling the anti-fuse device, and enabling a sense amplifier. Driving includes driving the selected wordline connected to an anti-fuse device of an anti-fuse memory cell to a read voltage. Charging includes charging the bitline electrically coupled to the anti-fuse device in response to the selected wordline at the read voltage. Decoupling includes decoupling the anti-fuse device from the bitline. Enabling includes enabling a sense amplifier to sense a voltage level of the bitline. According to an embodiment of the present aspect, the method further includes precharging the bitline and a reference bitline to a first voltage supply prior to driving the selected wordline. In this embodiment, charging includes adding a reference charge to the reference bitline, and driving includes driving the bitline to one of the first voltage supply and a second voltage supply, and driving the reference bitline to the other of the first voltage supply and the second voltage supply.

According to another embodiment of the present aspect, decoupling includes decoupling the bitline from a sense node of the sense amplifier, which can include turning off an isolation transistor between the bitline and the sense node of the sense amplifier. The selected wordline can be disabled after decoupling. In an alternate embodiment, the anti-fuse memory cell includes an access transistor connected between the bitline and the anti-fuse device, and decoupling includes turning off the access transistor. According to another embodiment of the present aspect, driving includes pulsing the selected wordline with a wordline pulsing scheme. The wordline pulsing scheme can include a single pulse, pulses having fixed width pulses, pulses having variable width pulses or pulses having partial pulses. Pulsing of the wordline can end after decoupling.

In a second aspect, there is provided a method for reading programmed and unprogrammed anti-fuse memory cells. The method includes i) pulsing a selected wordline connected to an anti-fuse device of an anti-fuse memory cell between a first voltage and a second voltage; ii) charging a bitline electrically coupled to the anti-fuse device in response to the selected wordline being pulsed; and, iii) enabling a sense amplifier to sense a voltage level of the bitline. According to the embodiments of the present aspect, the selected wordline has pulses with fixed widths, variable widths or pulses that rise to the first voltage and fall to a third voltage between the first voltage and the second voltage.

According to another embodiment of the second aspect, the method further includes decoupling the anti-fuse device before sensing. Pulsing of the wordline can end after decoupling, and decoupling can include decoupling the bitline from a sense node of the sense amplifier. Alternately, the anti-fuse memory cell can include an access transistor connected between the bitline and the anti-fuse device, and decoupling includes turning off the access transistor.

In a third aspect, there is provided an anti-fuse memory. The anti-fuse memory includes anti-fuse memory cells, wordline drivers, a voltage circuit and a pulse control circuit. The anti-fuse memory cells are connected to wordlines and bitlines. The wordline drivers drive the wordlines with at least one voltage level. The voltage circuit provides the at least one voltage level. The pulse control circuit enables and disables the wordline drivers to provide the at least one voltage level in accordance with a pulsing scheme. In one embodiment of the present aspect, the pulse control circuit enables and disables the wordline drivers at fixed intervals to provide pulses of a fixed width. In such an embodiment the voltage circuit can provide an intermediate voltage, and the wordline drivers are disabled to provide the intermediate voltage. The intermediate voltage can be greater than VSS. Alternately, the pulse control circuit enables and disables the wordline drivers at variable intervals to provide pulses of a variable width.

BRIEF DESCRIPTION OF THE DRAWINGS

Embodiments of the present invention will now be described, by way of example only, with reference to the attached Figures, wherein:

FIG. 1 is a circuit diagram of a DRAM-type anti-fuse cell;

FIG. 2 is a planar layout of the DRAM-type anti-fuse cell of FIG. 1;

FIG. 3 is a cross-sectional view of the DRAM-type anti-fuse cell of FIG. 2 along line A-A;

DETAILED DESCRIPTION

Generally, the present invention provides a method and circuit for improving the reliability and retention of unprogrammed anti-fuse memory cells. This is achieved by minimizing the tunneling current through the unprogrammed anti-fuse memory cells which can cause eventual gate oxide breakdown. The amount of time a read voltage is applied to the anti-fuse memory cells is reduced by pulsing a read voltage applied to a wordline connected to the unprogrammed anti-fuse memory cells, thereby reducing the tunneling current. Further tunneling current can be reduced by decoupling the unprogrammed anti-fuse memory cells from a sense amplifier that can drive the corresponding bitline to VSS.

Figure 4A:
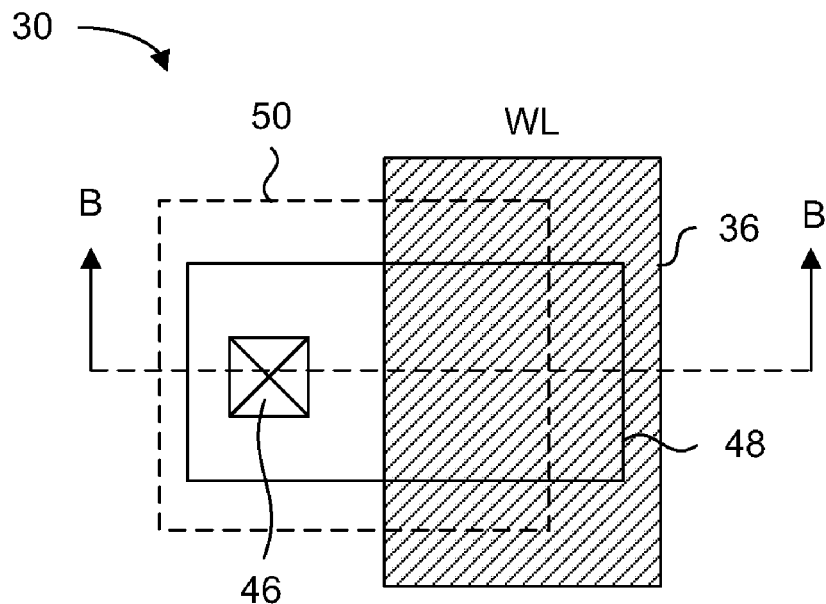
FIG. 4A is a planar layout of a variable thickness gate oxide anti-fuse device.
Figure 4B:
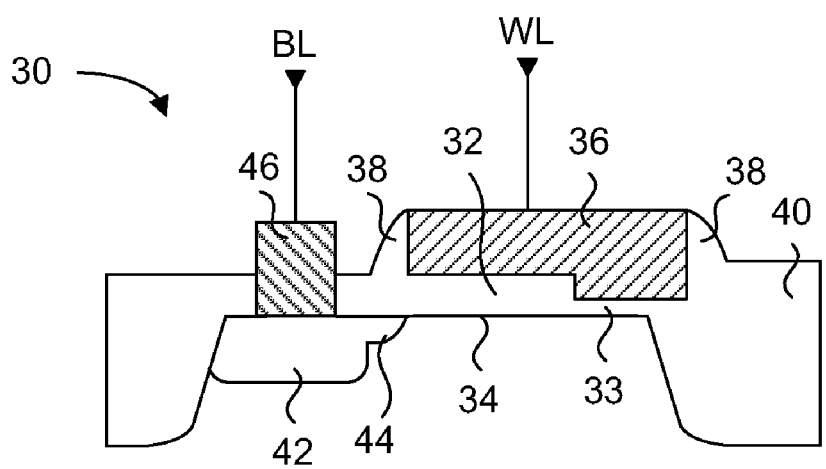
FIG. 4B is a cross-sectional view of the variable thickness gate oxide anti-fuse device of FIG. 4A.
Figure 4C:
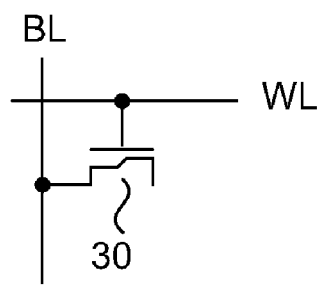
FIG. 4C is a transistor symbol representing the variable thick gate oxide anti-fuse device of FIGS. 4A and 4B.

The embodiments of the present invention can be applied to the anti-fuse memory cell of FIGS. 1 to 3. A disadvantage of the anti-fuse memory cell of FIGS. 1 to 3 is that two devices form the memory cell, an access transistor 10 and anti-fuse device 12, thereby increasing its footprint relative to other single device non-volatile memory cells such as Flash memory cells. For this reason, the anti-fuse memory cell of FIGS. 1 to 3 is referred to as a two transistor anti-fuse memory cell. Those skilled in the art understand that larger memory cells increase the size of the memory array, which increases the overall cost of the memory. FIGS. 4A to 4C show an example single transistor anti-fuse memory cell which has a smaller footprint than the two device anti-fuse memory cell of FIG. 1. This can also be referred to as an anti-fuse device.

FIG. 4B shows a cross-sectional view of an anti-fuse transistor taken along line B-B of the anti-fuse transistor show in FIG. 4A that can be manufactured with any standard CMOS process. This anti-fuse transistor and its variants are disclosed in commonly owned U.S. Pat. No. 7,402,855 issued on Jul. 22, 2008, and commonly owned U.S. Patent Publication No. 20070257331 A1 published on Nov. 8, 2007, the contents of which are incorporated by reference. In the presently shown example, the anti-fuse transistor is almost identical to a simple thick gate oxide, or input/output MOS transistor with one floating diffusion terminal. The disclosed anti-fuse transistor, also termed a split-channel capacitor or a half-transistor, can be reliably programmed such that the fuse link between the polysilicon gate and the substrate can be predictably localized to a particular region of the device. The cross-section view of FIG. 4B is taken along the channel length of the device. The channel is generally understood to be the area underneath an overlying polysilicon gate, having a length defined by edges of the polysilicon gate adjacent respective diffusion regions. Expressed in the alternative, the channel is underlying the polysilicon gate.

Anti-fuse cell 30 includes a variable thickness gate oxide formed on the substrate channel region 34, a polysilicon gate 36, sidewall spacers 38, a field oxide region 40, a diffusion region 42, and an LDD region 44 in the diffusion region 42. A bitline contact 46 is shown to be in electrical contact with diffusion region 42. The variable thickness gate oxide consists of a thick gate oxide 32 and a thin gate oxide 33 such that a portion of the channel length is covered by the thick gate oxide and the remaining portion of the channel length is covered by the thin gate oxide. Generally, the thin gate oxide is a region where oxide breakdown can occur. The thick gate oxide edge meeting diffusion region 42 on the other hand, defines an access edge where gate oxide breakdown is prevented and current between the gate 36 and diffusion region 42 is to flow for a programmed anti-fuse transistor. While the distance that the thick oxide portion extends into the channel region depends on the mask grade, the thick oxide portion is preferably formed to be at least as long as the minimum length of a high voltage transistor formed on the same chip.

In this example, the diffusion region 42 is connected to a bitline through a bitline contact 46, or other line for sensing a current from the polysilicon gate 36, and can be doped to accommodate programming voltages or currents. This diffusion region 42 is formed proximate to the thick oxide portion of the variable thickness gate oxide. To further protect the edge of anti-fuse cell 30 from high voltage damage, or current leakage, a resistor protection oxide (RPO), also known as a salicide protect oxide, can be introduced during the fabrication process to further space metal particles from the edge of sidewall spacer 38. This RPO is preferably used during the salicidiation process for preventing only a portion of diffusion region 42 and a portion of polysilicon gate 36 from being salicided. It is well known that salicided transistors are known to have higher leakage and therefore lower breakdown voltage. Thus having a non-salicided diffusion region 42 will reduce leakage. Diffusion region 42 can be doped for low voltage transistors or high voltage transistors or a combination of the two resulting in same or different diffusion profiles.

A simplified plan view of the anti-fuse cell 30 is shown in FIG. 4A. Bitline contact 46 can be used as a visual reference point to orient the plan view with the corresponding cross-sectional view of FIG. 4B. The active area 48 is the region of the device where the channel region 34 and diffusion region 42 is formed, which is defined by an OD mask during the fabrication process. The dashed outline 50 defines the areas in which the thick gate oxide is to be formed via an OD2 mask during the fabrication process. More specifically, the area enclosed by the dashed outline 50 designates the regions where thick oxide is to be formed. OD simply refers to an oxide definition mask that is used during the CMOS process for defining the regions on the substrate where the oxide is to be formed, and OD2 refers to a second oxide definition mask different than the first. According to an embodiment of the present invention, the thin gate oxide area bounded by edges of the active area 48 and the rightmost edge of the OD2 mask, is minimized. In the presently shown embodiment, this area can be minimized by shifting the rightmost OD2 mask edge towards the parallel edge of active area 48. FIG. 4C is a schematic showing a transistor symbol representing the anti-fuse cell 30 shown in FIGS. 4B and 4A. As can be seen in FIG. 4C, anti-fuse cell 30 has its gate connected to a wordline and its diffusion region 42 connected to a bitline. Commonly owned U.S. Patent Application No. 20070257331 A1 published on Nov. 8, 2007, the contents of which is incorporated by reference, describes alternate single transistor anti-fuse memory cells which can be used in a non-volatile memory array.

Figure 5A:
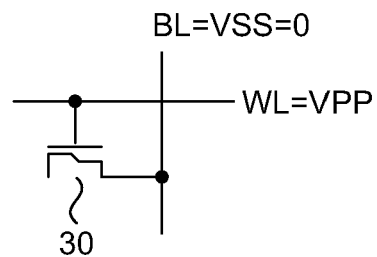
FIG. 5A is a schematic of the anti-fuse device of FIG. 4A under programming conditions.

FIG. 5A shows how an unprogrammed anti-fuse memory cell, such as anti-fuse memory cell 30, is programmed. Anti-fuse memory cell 30 has its gate terminal connected to a wordline WL and its single diffusion region connected to a bitline BL. Programming is effected by biasing the bitline to VSS and driving the wordline to a high voltage level VPP. VPP is selected based on the process technology and thickness of the thin gate oxide that is sufficient for forming a conductive link between the polysilicon gate and the channel region.

Figure 5B:
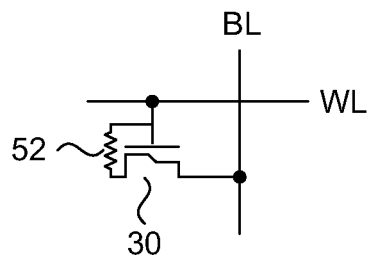
FIG. 5B is a schematic of a programmed anti-fuse device of FIG. 4A.

A successfully programmed anti-fuse memory cell 30 is shown in FIG. 5B, where a conductive link 52 is formed between the polysilicon gate and the channel region. Conductive link 52 is schematically represented as a resistive connection between the wordline and the channel region under the thin gate oxide region of anti-fuse memory cell 30. Therefore a programmed anti-fuse transistor having a conductive link stores one logic state of one bit of data. Accordingly, an unprogrammed anti-fuse transistor will by default store the other logic state of one bit of data. To prevent programming of the anti-fuse memory cell 30, the bitline is biased to a positive voltage such as VDD while the wordline is driven to VPP. This will be sufficient for inhibiting the conductive link from forming.

Figure 5C:
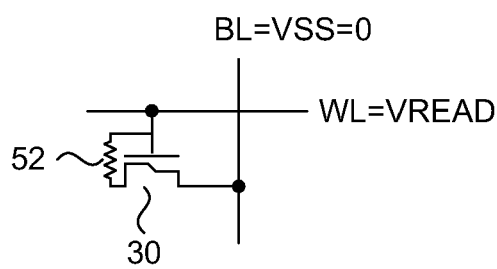
FIG. 5C is a schematic of a programmed anti-fuse device of FIG. 4A under read conditions.

Reading the anti-fuse transistor is achieved by driving the wordline to a read voltage VREAD, and by precharging the bitline to VSS, as shown in FIG. 5C. If the anti-fuse memory cell 30 has a conductive link 52, then the wordline will pull the bitline towards the VREAD voltage level via the conductive link 52 and the positive gate voltage of the anti-fuse transistor. This bitline voltage can be sensed and amplified by sense amplifier circuits. On the other hand, if the anti-fuse memory cell 30 is not programmed, ie. does not have a conductive link 52, then the bitline will remain at approximately VSS. According to the present embodiments, VREAD can be VDD or any positive voltage sufficiently high to turn on the anti-fuse memory call and charge its bitline to a positive voltage through the conductive link.

Figure 5D:
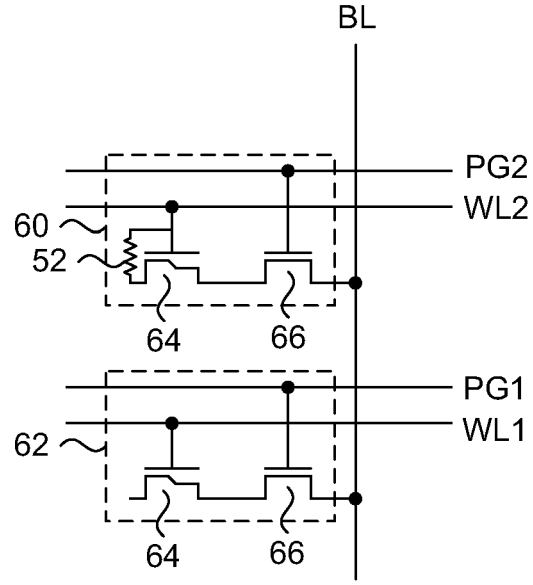
FIG. 5D is a schematic showing programmed and unprogrammed two transistor anti-fuse memory cells.

As previously mentioned, the embodiments of the present invention can be applied to single transistor and two transistor anti-fuse memory cells. FIG. 5D shows a programmed two transistor anti-fuse memory cell 60 and an unprogrammed two transistor anti-fuse memory cell 62. Both memory cells 60 and 62 include an anti-fuse transistor or device 64 and an access transistor 66 connected in series with a bitline BL. The gates of anti-fuse transistors 64 are connected to respective wordlines WL1 and WL2, while the gates of access transistors 66 are connected respective pass gate control signals PG1 and PG2. Anti-fuse transistors 64 can be the same as anti-fuse memory cells 30 shown in FIGS. 5A to 5C. Accordingly, anti-fuse transistor 64 of memory cell 60 has a conductive link 52 to show its programmed state. Alternately, anti-fuse memory cells 60 and 62 can also be similar to the anti-fuse memory cell shown in FIGS. 1 to 3. The biasing conditions for programming anti-fuse memory cell 60 can be the same as shown in FIG. 5A, with the additional step of ensuring that access transistor 66 is turned on during programming. To inhibit programming of anti-fuse memory cell 62, the bitline BL is biased to a positive voltage such as VDD while the wordline WL1 is driven to VPP. Pass gate control signal PG1 can be at least VPP during programming. This will be sufficient for inhibiting the conductive link from forming.

From this point forward, it is assumed that any reference to memory cells or OTP memory cells in the embodiments, refers to anti-fuse memory cell 30. It should be noted that gate oxide breakdown of anti-fuse memory cells not selected for programming during programming operations is negligible. This is due to the fact that any anti-fuse memory cell which is not to be programmed has its corresponding bitline biased to minimize the electrical field across its gate oxide. In the presently shown embodiments, the bitlines are biased to VDD while the wordlines are driven to the higher programming voltage VPP. The exposure of unprogrammed anti-fuse memory cells to premature or unintended gate oxide breakdown due to the tunneling current occurs during read operations. The retention problem of unprogrammed anti-fuse memory cells is now illustrated with reference to FIG. 6.

Figure 6:
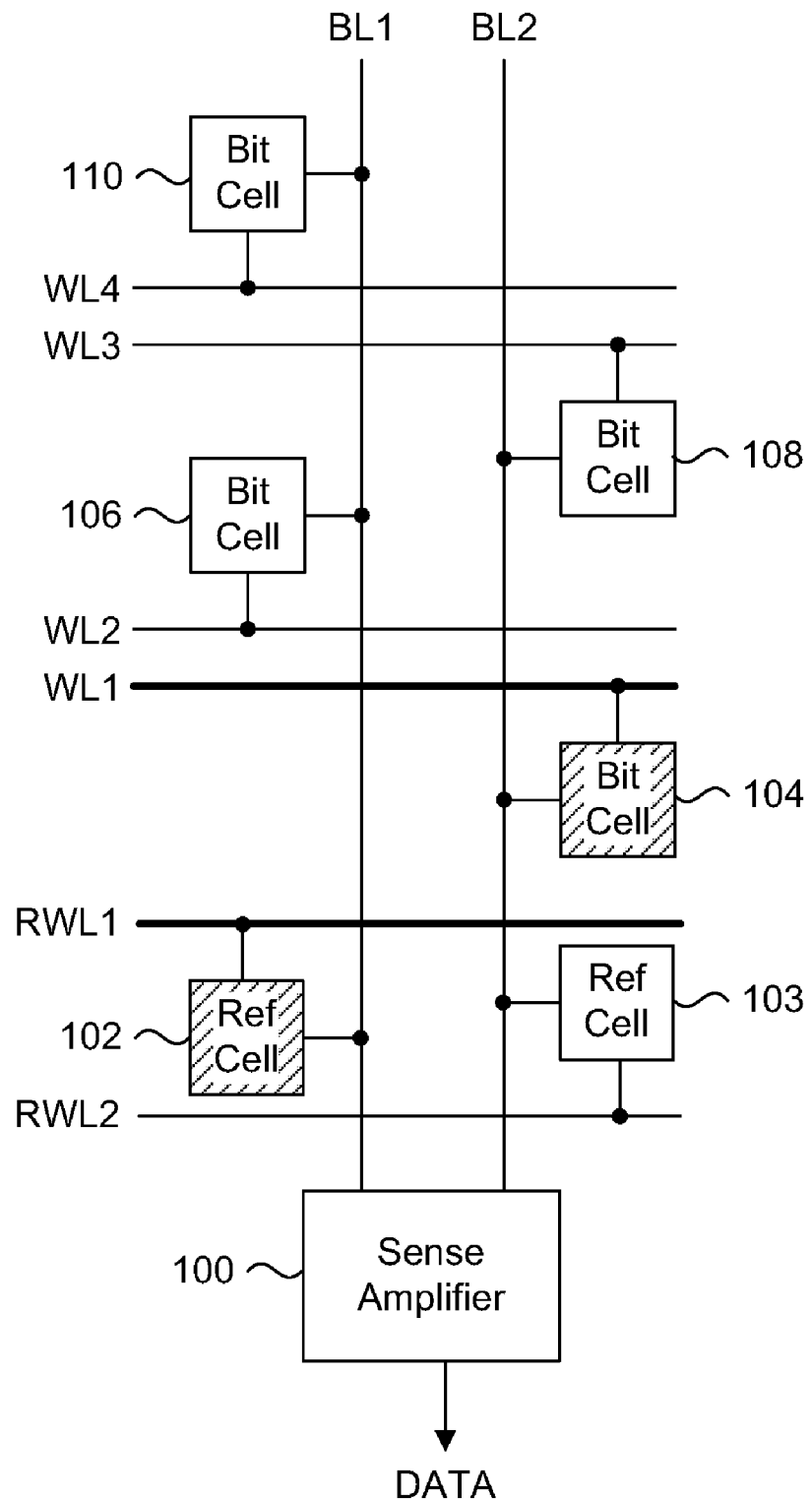
FIG. 6 is an illustration of a single-ended read mode according to a present embodiment.

FIG. 6 is a simplified schematic of an anti-fuse memory array having bitlines BL1 and BL2 connected to a bitline sense amplifier 100 having a pair of complementary inputs, four wordlines WL1, WL2, WL3 and WL4, two reference wordlines WL1 and WL2, reference cells 102 and 103, and anti-fuse memory cells 104, 106, 108 and 110. Alternately, a circuit for providing a reference level can be used for applying the reference level onto either BL1 or BL2 instead. Each of the anti-fuse memory cells has its gate terminal connected to a respective wordline, and has its single diffusion region connected to a respective bitline.

It is first assumed that BL1 and BL2 are first precharged to a voltage level, such as VSS for example. Wordline WL1 is then driven to a positive read voltage, referred to as VREAD, and wordline RWL1 connected to reference cell 102 is driven such that the reference cell 102 provides a reference level onto BL1. Assuming that cell 104 is not programmed, BL2 will have a bitline level that is less than the reference level of BL1. After a predetermined amount of time after WL1 and RWL1 are driven, sense amplifier 100 is enabled to detect the level difference between BL1 and BL2. Because BL1 is at a higher level than BL2, sense amplifier 100 drives BL1 to the full high logic level of VDD for example, and BL2 to the full low logic level of VSS for example.

It is noted that the presently described anti-fuse memory array can be configured for voltage sensing or current sensing, by using the appropriate type of circuit for sense amplifier 100. In voltage sensing, the aforementioned bitline level is a voltage level that charges towards VREAD, while the reference level is set to some mid-point voltage level. In current sensing, the aforementioned bitline level is a current level determined largely by VREAD and the presence or absence of a conductive link in cell 104, while the reference level is set to a reference current level. Such a reference current level can be determined by setting geometric parameters of the reference cells 102 and 103, and/or by adjusting the voltage level of RWL1 and RWL2 for example. From this point on, it is assumed that voltage sensing is used in the following embodiments.

In the read scenario described above, the potential for gate oxide breakdown is maximized for two reasons. First WL1 is maintained at the read voltage VREAD for a maximum duration of time during the read cycle. The read voltage VREAD can be higher than the maximum voltage used elsewhere in the memory device, such as for logic circuits. For example, if the logic circuits use a 1.2V VDD power supply, then VREAD can be as high as 1.8V. This means that more time is allowed for the tunneling current to develop through the gate oxide. Second, the sense amplifier 100 is enabled to drive bitline BL2 to VSS. With WL1 at VREAD and BL2 at VSS, the magnitude of the tunneling current is maximized.

Therefore in the single-ended read mode architecture of FIG. 6, persistent gate oxide breakdown can result in a situation where the level of BL2 rises to a level that is no longer distinguishable from the reference level of BL1. It is even possible that the level of BL2 rises above the reference level of BL1. In both cases, erroneous data can be sensed. To mitigate this effect, a high reliability read mode can be used. A variety of high reliability read modes are disclosed in commonly owned U.S. patent application Ser. No. 12/701,104, filed on Feb. 5, 2010. By example, a differential read mode can be used whereby two anti-fuse cells are used to store one bit of data as complementary logic states. Therefore the logic states of the two anti-fuse cells are compared to each other to provide improved margin relative to the single-ended read mode.

Figure 7:
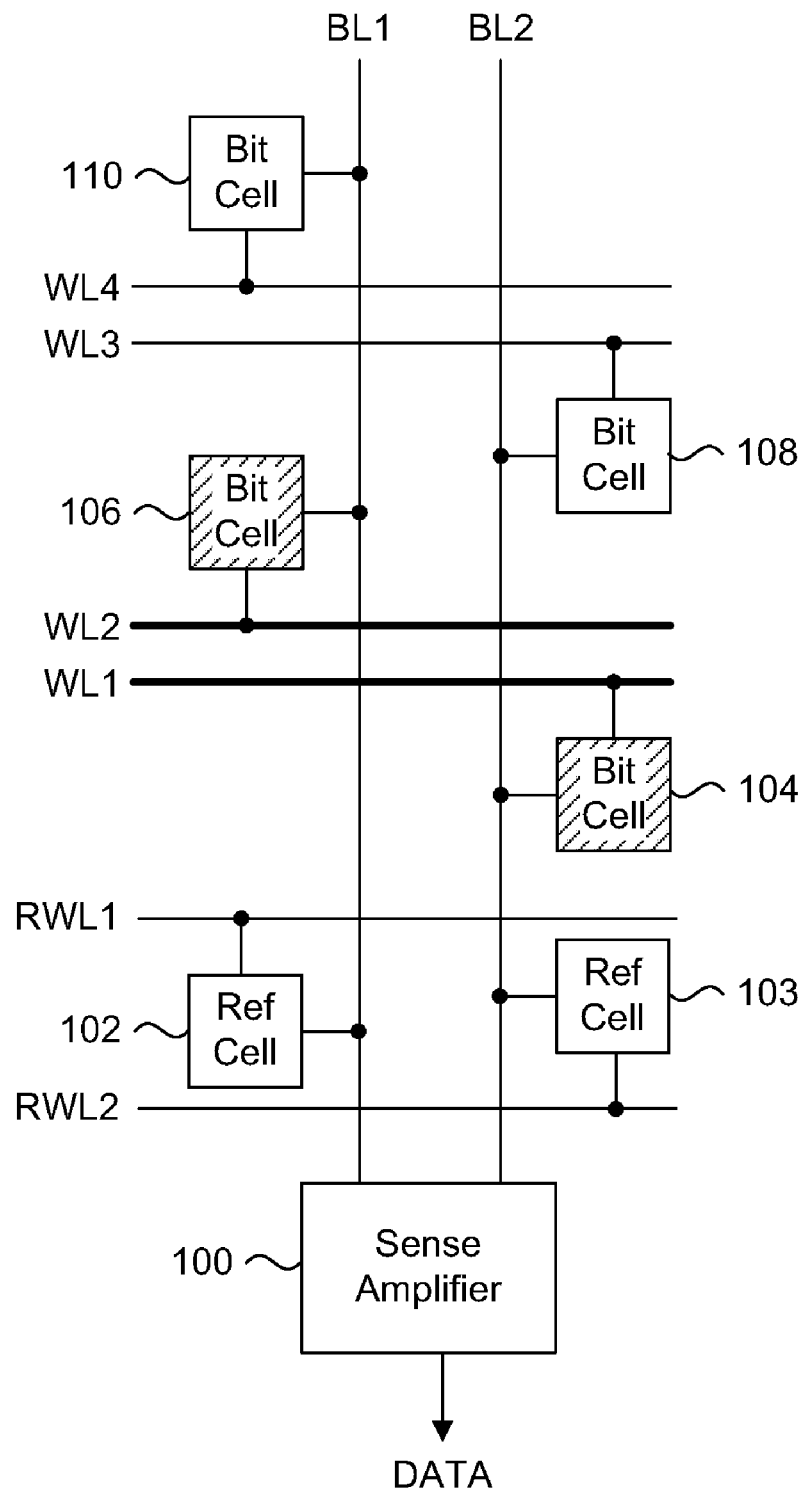
FIG. 7 is an illustration of a differential read mode according to a present embodiment.

FIG. 7 shows the anti-fuse memory array of FIG. 6 for illustrating the differential read mode of operation. For example, one cell such as cell 104 connected to one bitline BL2 stores the true logical value of the data, while a second cell such as cell 106 connected the other bitline BL1 stores the complement of the true logical value of the data. Hence BL1 acts as a reference bitline in this example. In the differential read mode, one of the two cells is always programmed. For example, if cell 104 stores a logic "1" value, then cell 106 stores a logic "0" value. In the differential read mode, no reference voltage is required for bitlines BL1 or BL2, hence reference cells 102 and 103, or any reference circuit is not used. During the read operation, wordlines WL1 and WL2 are simultaneously driven to VREAD. Since BL1 and BL2 are precharged to VSS in this example, the unprogrammed cell should not substantially change the voltage of its respective bitline. However, the programmed cell charges its respective bitline towards VREAD. Therefore the sense amplifier 100 compares cells 104 and 106 against each other to provide a determination of the true logic state of the data stored in cell 104. Accordingly, the read margin provided by the differential read mode is significantly improved over the single-ended read mode. However, even this read margin can eventually be eroded by gate oxide breakdown in the unprogrammed anti-fuse memory cell due to repeated read cycles.

The following embodiments for reducing tunneling current in an unprogrammed anti-fuse memory cell can be applied to anti-fuse memories operating under a single-ended read mode of operation or a differential read mode of operation. In a first embodiment, the anti-fuse memory cells are decoupled from the sense amplifier before the sense amplifier is enabled during a read operation. In a second embodiment, the selected wordline is pulsed to reduce the duration of time the read voltage VREAD is applied to the gate of the anti-fuse transistors. Both embodiments can be used independently of each other, or can be used in conjunction with each other.

Figure 8A:
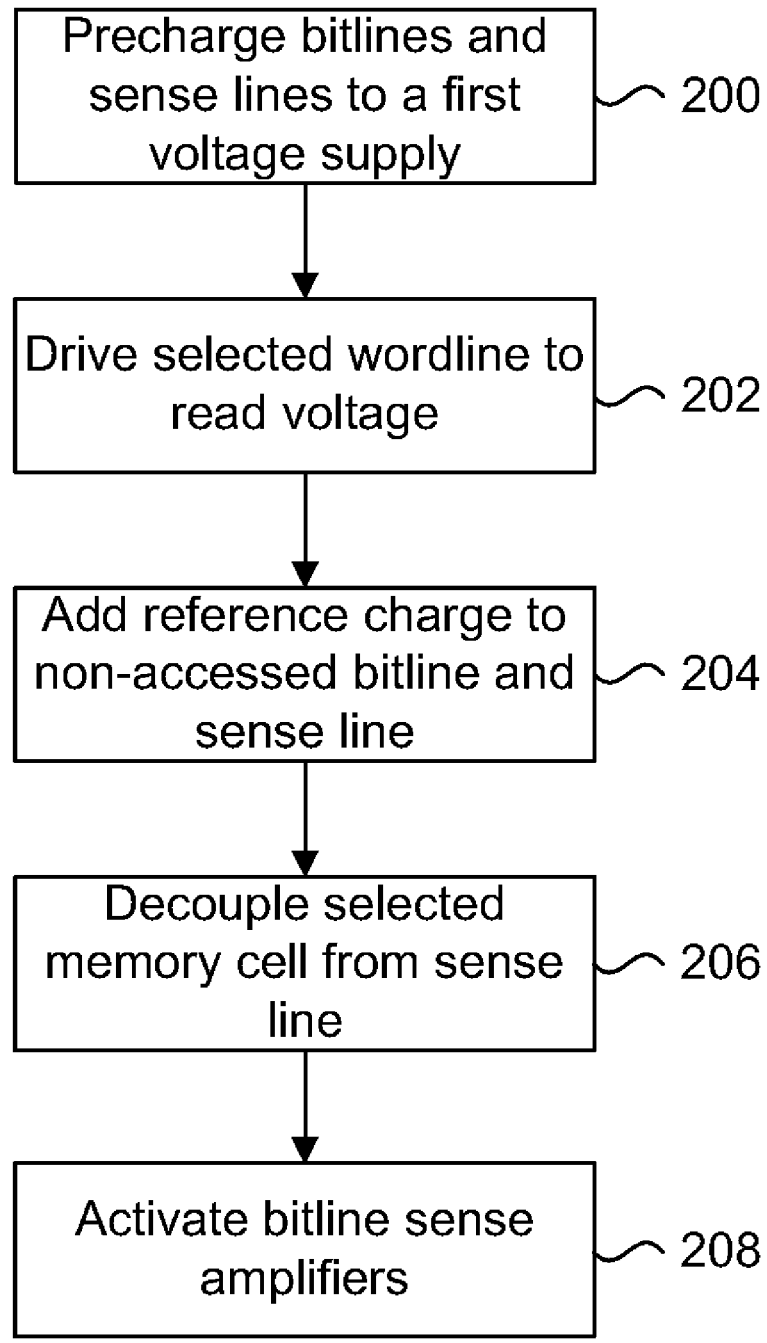
FIG. 8A is a flow chart of a method for reducing tunneling current in an unprogrammed anti-fuse memory cell in a read operation, according to a present embodiment.

FIG. 8A is a flow chart of a method for reducing tunneling current in an unprogrammed anti-fuse memory cell according to the first embodiment. The method of FIG. 8A shows the steps required for reading an anti-fuse memory cell, and begins by precharging the bitlines to a first voltage supply at step 200. The first voltage supply can be VSS for example. Following at step 202, a selected wordline is driven to the read voltage VREAD. If programmed, the anti-fuse memory cell charges its bitline towards VREAD via its formed conductive link. If unprogrammed, the anti-fuse memory cell may charge its bitline slowly via tunneling current through its gate oxide. At substantially the same time, a reference charge is added to the other bitline at step 204, referred to as a reference bitline. This is done by accessing a reference cell connected to the other bitline, or activating a reference circuit. Following a step 206, the anti-fuse memory cell is decoupled from the bitline, and in particular a sense node or sense line of the bitline sense amplifier. Finally at step 208, the bitline sense amplifier is enabled to sense the voltage difference on the sense nodes of the bitline sense amplifier.

Figure 8B:
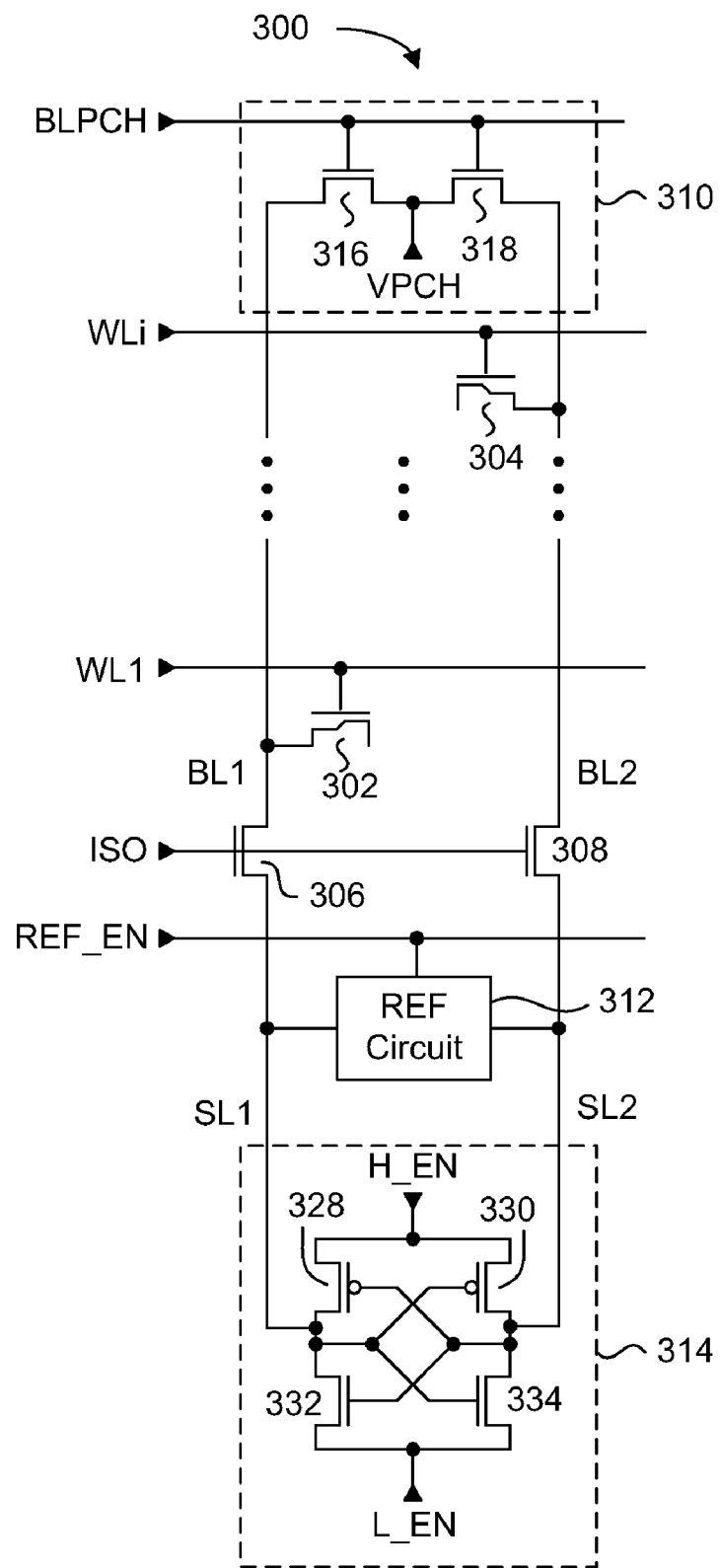
FIG. 8B is a circuit schematic of a single-transistor anti-fuse memory array.

A circuit schematic of an anti-fuse array is now shown in FIG. 8B to facilitate a description of the method described in FIG. 8A.

FIG. 8B is a circuit schematic of a portion of an anti-fuse memory array. In order to simplify the schematic, only one bitline pair BL1/BL2, its associated bitline sensing circuitry, and two wordlines are shown. Anti-fuse memory array 300 includes wordlines WL1 to WLi connected to the gate terminals of n-channel anti-fuse memory cells 302 and 304 respectively, n-channel isolation transistors 306 and 308 for coupling the upper portion of the bitlines to the lower portion of the bitlines, referred to as sense lines or a sense node, in response to signal ISO, and bitline sensing circuitry. The variable "i" in WLi is used to denote the last wordline in the memory array, where i is an integer number. The anti-fuse memory cells 302 and 304 can be the same as those previously shown in FIGS. 4A to 4C. The bitline sensing circuitry includes a precharge circuit 310, a reference charge circuit 312, and a bitline sense amplifier 314.

The precharge circuit 310 includes two n-channel precharge transistors 316 and 318 connected in series between BL1 and BL2 and have their gate terminals connected to precharge signal BLPCH. The shared source/drain terminal of precharge transistors 316 and 318 receives a precharge voltage VPCH. In operation, both precharge transistors 316 and 318 will turn on to precharge bitlines BL1 and BL2 to VPCH in response to an active high logic level of BLPCH, in preparation for a read operation.

The reference charge circuit 312 is not shown in detail, but can include circuits for selectively applying a reference charge onto BL1 or BL2 in response to an enable signal REF_EN, depending on which anti-fuse memory cell is selected for the read operation. Alternately, the reference charge circuit 312 can include reference cells configured for providing the reference charge onto BL1 or BL2, and the enable signal REF_EN can be connected to the gate of the selected reference cell.

The bitline sense amplifier 314 consists of a standard cross-coupled inverter circuit that is well known in the art. The circuit includes p-channel transistors 328 and 330, both connected in series to respective n-channel transistors 332 and 334. The common drain terminal of p-channel transistors 328 and 330 receives a high logic level enable signal H_EN, while the common source terminal of n-channel transistors 332 and 334 receives a low logic level enable signal L_EN. H_EN can be a lowered internal VCC level, while L_EN can be a VSS level. The operation of bitline sense amplifier 314 in the DRAM art is well known. When enable signals H_EN and L_EN are activated, either at the same time or at different times, bitline sense amplifier 314 will sense a small voltage differential between BL1 and BL2, and drive both BL1 and BL2 to the full logic level states of H_EN and L_EN.

Figure 8C:
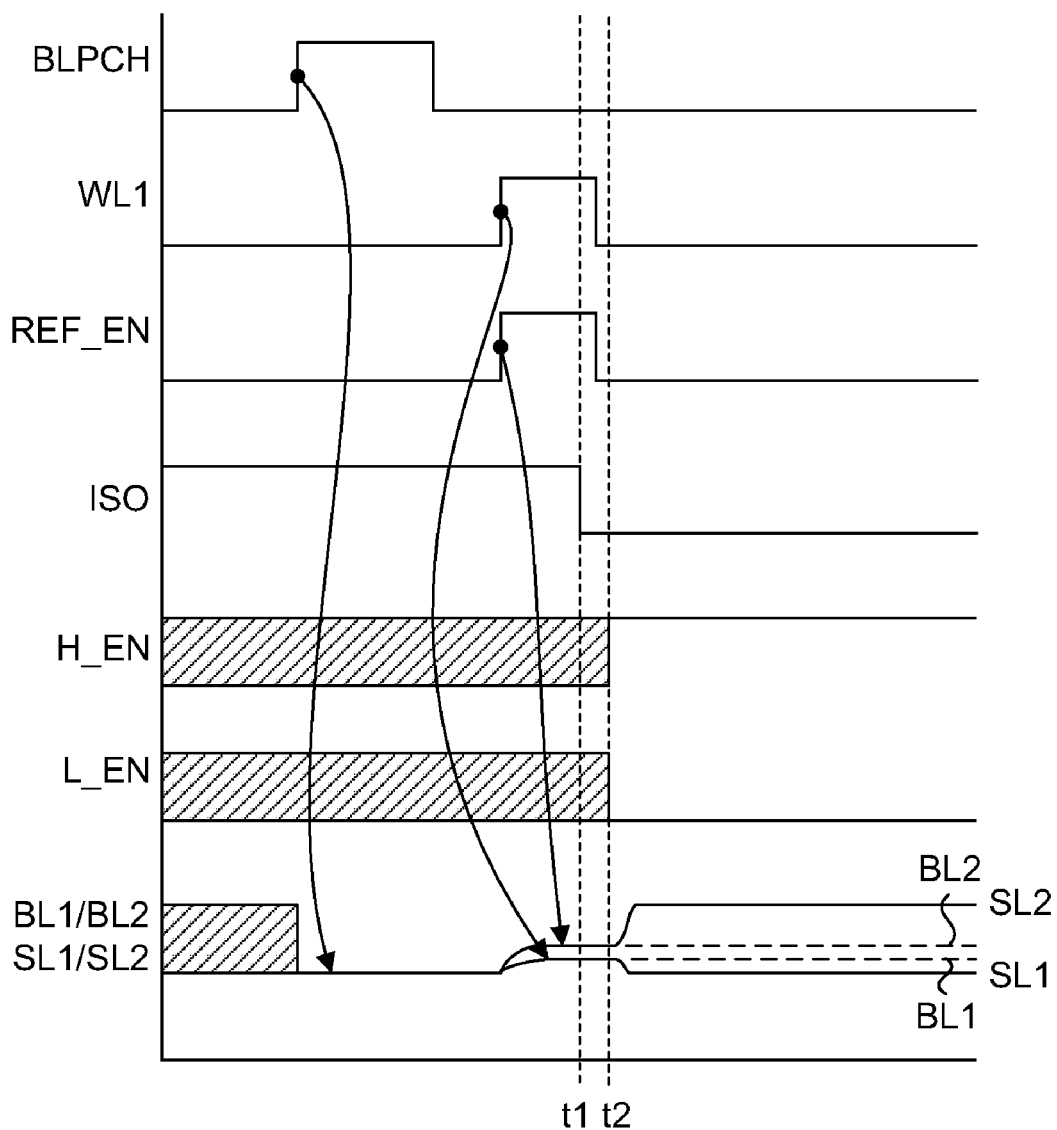
FIG. 8C is a sequence diagram showing the operation of the memory array of FIG. 8B.

The read operation of memory array 300 according to the method of FIG. 8A for reducing tunneling current in an unprogrammed anti-fuse memory cell is now described with further reference to FIG. 8C. FIG. 8C is a sequence diagram showing the signal traces and voltage levels for the signals shown in FIG. 8B. It is assumed that anti-fuse memory cell 302 is to be accessed during the read operation. Anti-fuse memory cell 302 is assumed to be unprogrammed. The read operation begins at step 200 where the bitlines are precharged to a predetermined voltage level. In the presently shown example of FIG. 8B, the bitlines BL1 and BL2 are precharged to VSS in response to the rising edge of BLPCH while the isolation transistors 306 and 308 are turned on by ISO being at the high logic level. Therefore bitlines BL1, BL2 and sense lines SL1, SL2 are precharged to VSS. A selected wordline WL1 is driven to a read voltage VREAD at step 202, which is represented in FIG. 8C by WL1 rising to the high logic level. A small charge may be added to BL1 due to some tunneling current through cell 302.

At about the same time at step 204, reference enable signal REF_EN rises to the high logic level to add a reference charge to the unselected bitline BL2. REF_EN can be a reference wordline connected to a reference cell, or REF_EN can be a control signal that enables a reference circuit to provide the charge. It should be noted that step 204 is optional since a reference charge is not required for a memory array configured for the differential read mode of operation. As shown in FIG. 8C, BL1/SL1 connected to cell 302 rises slightly above the VSS precharge level while BL2/SL2 rises to a reference level higher than BL1/SL1. Following at step 206, cell 302 is decoupled from sense amplifier 314 at time t1. In the example of FIG. 8B, this decoupling is achieved by turning off isolation transistors 306 and 308. In FIG. 8C, the isolation transistors 306 and 308 are turned off when signal ISO drops to the low logic level. It is noted that BL1 and SL1 remain at substantially the same voltage level, as do BL2 and SL2. According to the present embodiment, WL1 is disabled by driving it to the low logic level after time t1 since the cell 302 has no effect on sense lines SL1 and SL2, thereby saving power. This is referred to as a wordline pulse, which is described in further detail later. Later at step 208 the sense amplifier 314 is activated (or enabled) by driving H_EN to the high logic level and L_EN to the low logic level at time t2.

Now sense amplifier 314 senses the voltage difference between SL1 and SL2 only, because the isolation transistors 306 and 308 have decoupled them from BL1 and BL2 respectively. Because SL2 has a higher voltage level than SL1, sense amplifier 314 senses the difference and drives SL2 to the voltage level of H_EN while driving SL1 to the voltage level of L_EN. However, because isolation transistors 306 and 308 are turned off, BL1 and BL2 remain unaffected by the actions of sense amplifier 314. Hence the voltage levels of BL1 and BL2 are shown in FIG. 8C as being at the same levels as before time t1. Accordingly, cell 302 is never coupled to VSS during the read operation, thereby reducing the tunneling current through its gate oxide. The decoupling action can occur immediately before the sense amplifier is enabled, or any time before the sense amplifier is enabled, provided the bitlines and sense lines have charged to levels that can be sensed. This sensing scheme differs from DRAM sensing, which requires the bitlines to be connected to the sense amplifier during sensing in order to restore data to cells.

In the presently described memory array consisting of single transistor anti-fuse memory cell, decoupling is achieved by turning off the isolation transistors 306 and 308. According to an alternate embodiment, isolation transistors are not required if two transistor anti-fuse memory cells, such as the ones in FIGS. 1 to 3 or FIG. 5D are used. In this present embodiment, the access transistor is controlled to decouple the anti-fuse device or the anti-fuse transistor from the bitline before the sense amplifier is enabled.

Figure 9A:
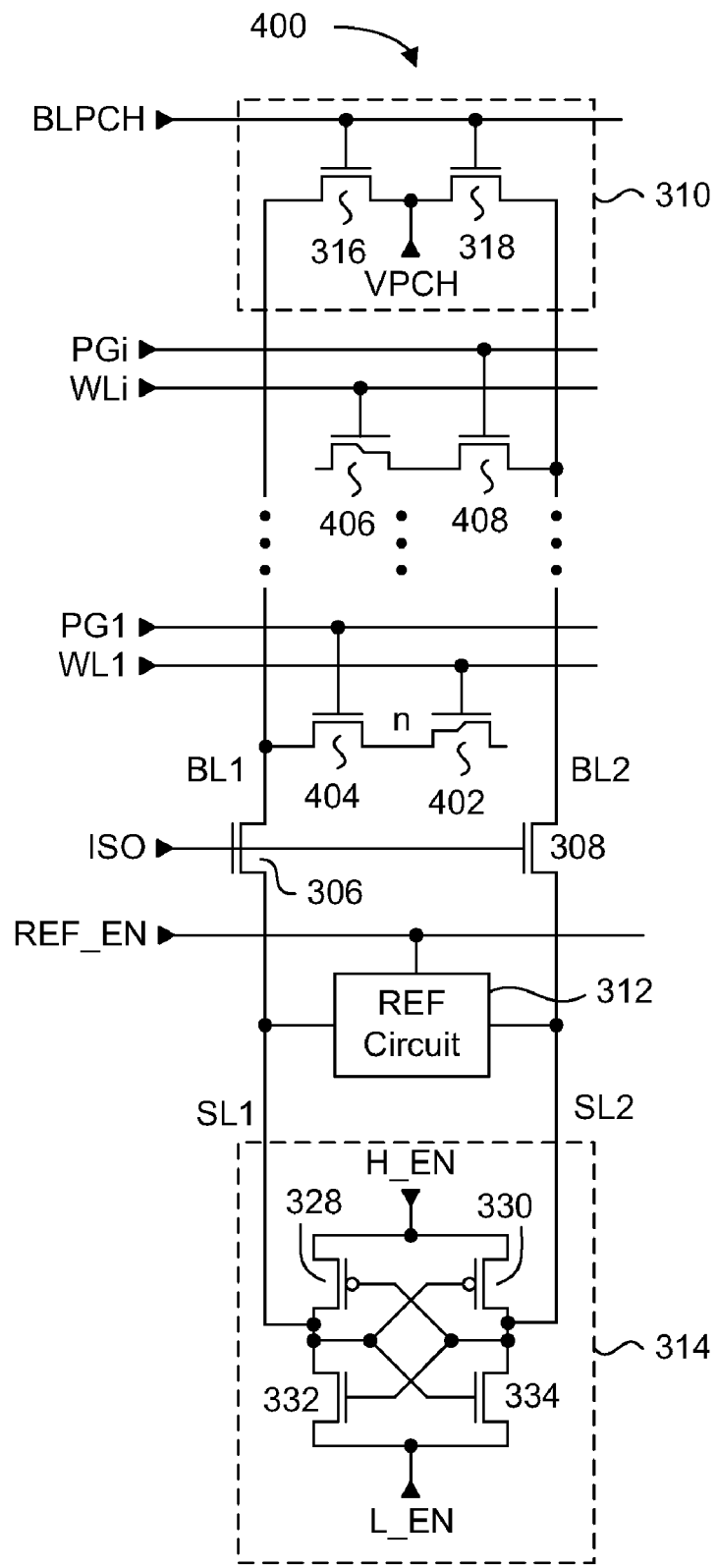
FIG. 9A is a circuit schematic of a two transistor anti-fuse memory array.

FIG. 9A is a circuit schematic of a portion of a two transistor anti-fuse memory array 400. Most of the elements shown in FIG. 9A are the same as those shown in FIG. 8B, and therefore appear with the same reference numerals. In the example of FIG. 9A, the single-transistor anti-fuse memory cells are replaced with two-transistor anti-fuse memory cells similar to those previously shown in FIG. 5D. A first shown anti-fuse memory cell includes an anti-fuse transistor 402 and an access transistor 404 connected in series with bitline BL1. The gate of anti-fuse transistor 402 is connected to pass gate control signal PG1 while the gate of access transistor 404 is connected to wordline WL1. The shared source/drain of anti-fuse transistor 404 and access transistor 404 is labeled as node "n". A second shown anti-fuse memory cell includes an anti-fuse transistor 406 and an access transistor 408 connected in series with bitline BL2. The gate of anti-fuse transistor 406 is connected to pass gate control signal PG21 while the gate of access transistor 408 is connected to wordline WLi, where i is an integer and WLi is the last wordline in the memory array. In the present embodiment, the pass gate control signals are controlled to decouple the anti-fuse transistor it is connected to during the read operation.

Now the method sequence of FIG. 8A is applied to the memory array 400, and described with reference to the sequence diagram of FIG. 9B. First, it is assumed that the anti-fuse memory cell consisting of anti-fuse transistor 402 and access transistor 404 is to be accessed during the read operation. Second, it is assumed that anti-fuse transistor 402 is unprogrammed.

The read operation begins at step 200 where the bitlines are precharged to a predetermined voltage level. In the presently shown example of FIG. 9A, the bitlines BL1 and BL2 are precharged to VSS in response to the rising edge of BLPCH while the isolation transistors 306 and 308 are turned on by ISO being at the high logic level. Therefore bitlines BL1, BL2 and sense lines SL1, SL2 are precharged to VSS. A selected wordline WL1 and pass gate control signal PG1 are both driven to a read voltage VREAD at step 202, which is represented in FIG. 9B by WL1 rising to the high logic level and PG1 rising to the high logic level. In the present embodiments, PG1 can be driven to the voltage supply level. Since access transistor 404 is turned on, a small charge may be added to BL1 due to some tunneling current through anti-fuse transistor 402. At about the same time at step 204, reference enable signal REF_EN rises to the high logic level to add a reference charge to the unselected bitline BL2. REF_EN can be a reference wordline connected to a reference cell, or REF_EN can be a control signal that enables a reference circuit to provide the charge. It should be noted that step 204 is optional since a reference charge is not required for a memory array configured for the differential read mode of operation.

Figure 9B:
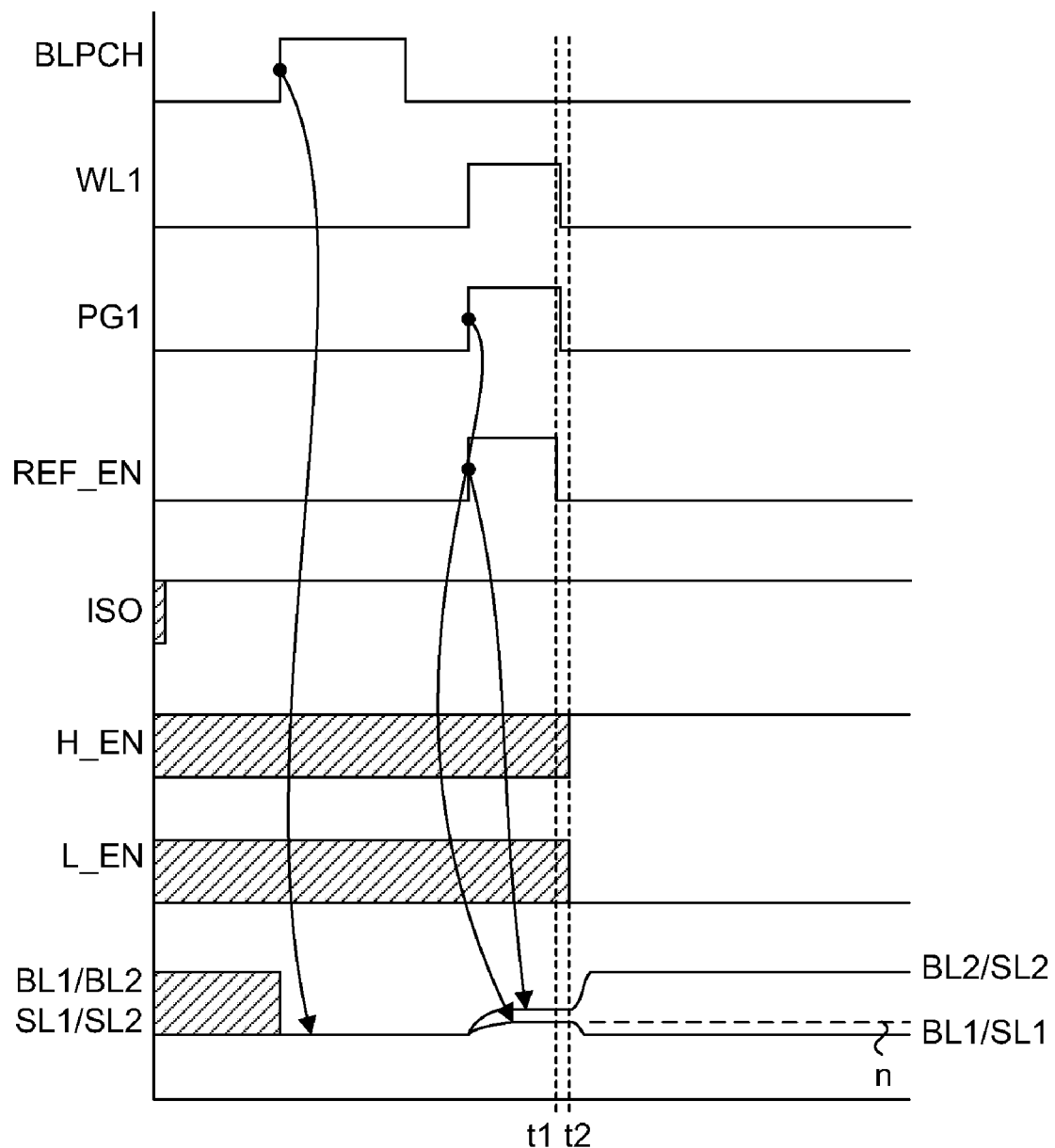
FIG. 9B is a sequence diagram showing the operation of the memory array of FIG. 9A.

As shown in FIG. 9B, BL1/SL1 connected to anti-fuse transistor 402 rises slightly above the VSS precharge level while BL2/SL2 rises to a reference level higher than BL1/SL1. Following at step 206, anti-fuse transistor 402 is decoupled from sense amplifier 314 at time t1. In the example of FIG. 9A, this decoupling is achieved by turning off access transistor 404. In FIG. 9B, access transistor 404 is turned off when signal PG1 drops to the low logic level. WL1 can be turned off at about the same time to conserve power and minimize exposure of the anti-fuse device to VREAD. Because isolation transistors 306 and 308 are still turned on, BL1 and SL1 remain at substantially the same voltage level, as do BL2 and SL2. Later at step 208 the sense amplifier 314 is activated (or enabled) by driving H_EN to the high logic level and L_EN to the low logic level at time t2.

Now sense amplifier 314 senses the voltage difference between SL1 and SL2, which are coupled to BL1 and BL2 via isolation transistors 306 and 308. Because SL2/BL2 has a higher voltage level than SL1/BL1, sense amplifier 314 senses the difference and drives SL2/BL2 to the voltage level of H_EN while driving SL1/BL1 to the voltage level of L_EN. However, because access transistor 404 is turned off, node n remains unaffected by the actions of sense amplifier 314. As shown in FIG. 9B, node n remains at the same level as before time t1. Accordingly, anti-fuse transistor 402 is never coupled to VSS during the read operation, thereby reducing the tunneling current through its gate oxide. The specific time for decoupling the anti-fuse transistor 402 from the bitline can occur immediately before the sense amplifier is enabled, or any time before the sense amplifier is enabled, provided the bitlines and sense lines have charged to levels that can be sensed.

As shown in the embodiments of FIGS. 8A to 9B, the gate oxide of the anti-fuse transistor can be decoupled and isolated from the bitline sense amplifier before sensing. Not only does this reduce the amount of tunneling current through an unprogrammed anti-fuse memory cell, power consumption is reduced since a current path from the unprogrammed cell to VSS by the enabled sense amplifier is blocked. Minimizing power consumption is an important criteria for RF-ID applications, where very little on-chip power is generated on-chip by RF radiation received from a scanning source.

Figure 10A:
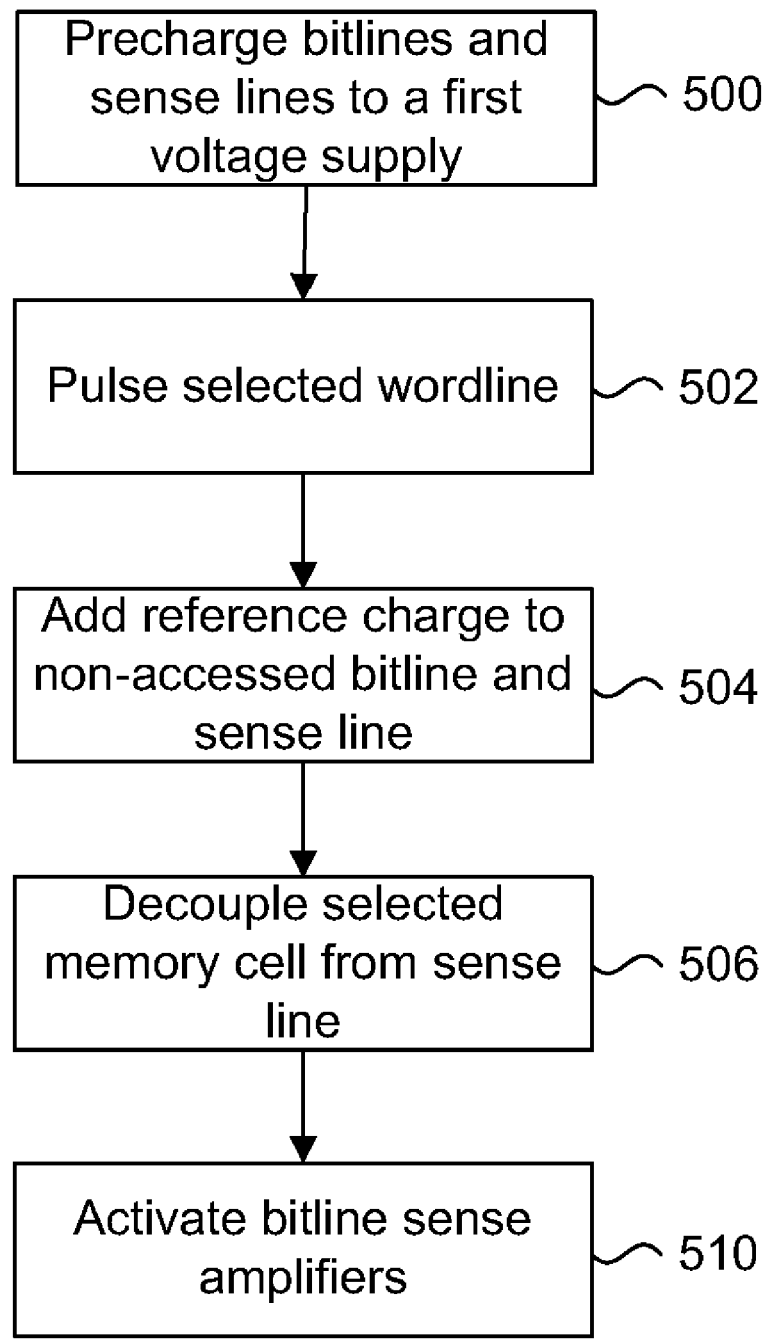
FIG. 10A is a flow chart of an alternate method for reducing tunneling current in an unprogrammed anti-fuse memory cell in a read operation, according to a present embodiment.

Another technique for further reducing tunneling current and correspondingly, power consumption, is now discussed. In the previously described embodiments, the selected wordline during a read operation is held statically at the read voltage VREAD. In the present embodiments, the wordline can pulsed during the read operation. FIG. 10A is a flow chart of the read method shown in FIG. 8A, but modified to illustrate how the pulsed wordline technique can be combined with the anti-fuse memory cell decoupling technique.

Figure 10B:
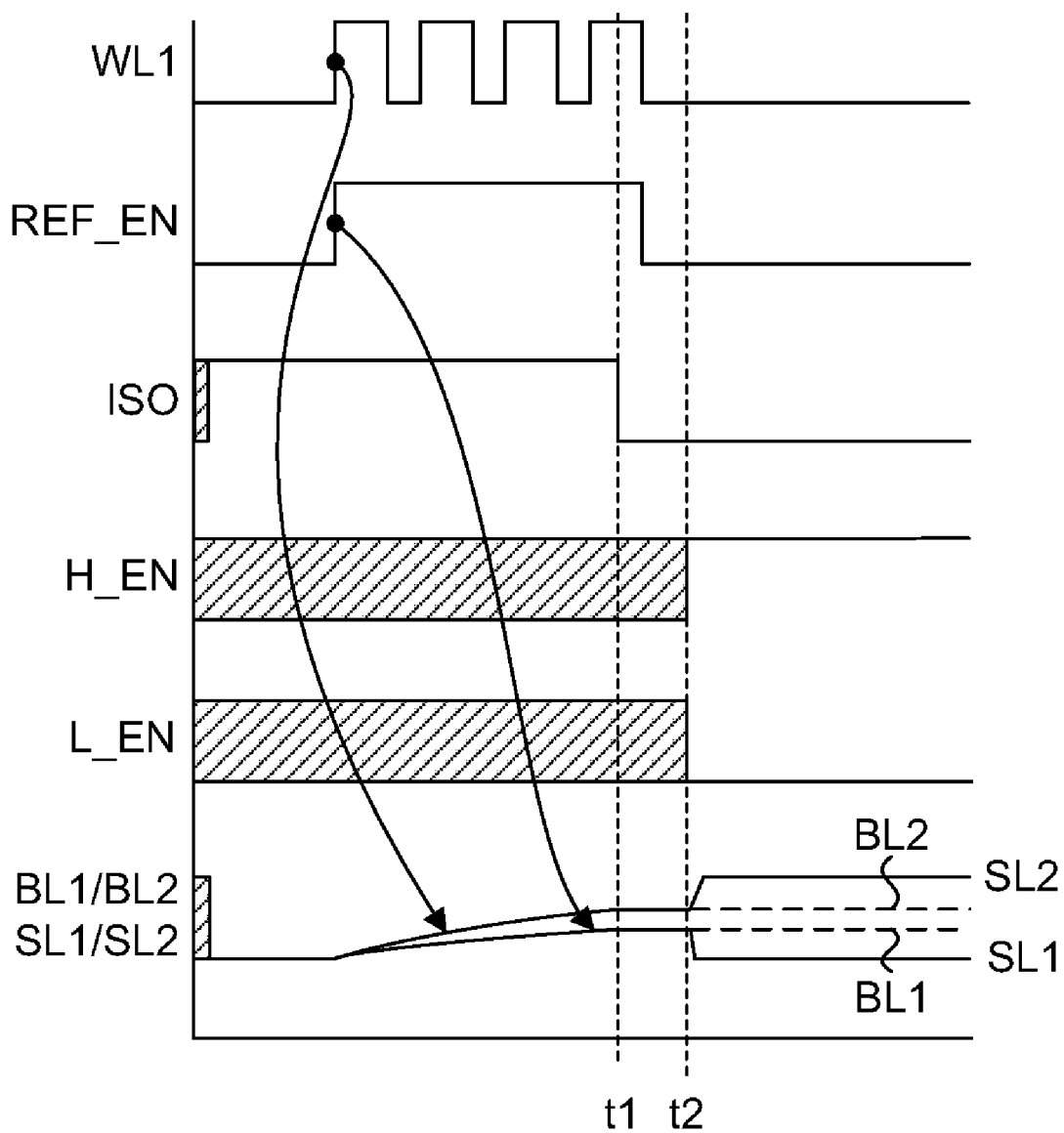
FIG. 10B is a sequence diagram showing the operation of the memory array of FIG. 8B according to the method of FIG. 10A.

The following discussion of the method of FIG. 10A is made with reference to the sequence diagram of FIG. 10B which shows the signal traces and voltage levels for the signals shown in the memory array 300 of FIG. 8B. It is assumed that anti-fuse memory cell 302 is to be accessed during the read operation, and that anti-fuse memory cell 302 is unprogrammed. The read operation begins at step 500 where the bitlines are precharged to a predetermined voltage level, such as VSS, in response to the rising edge of BLPCH while the isolation transistors 306 and 308 are turned on by ISO being at the high logic level. A selected wordline WL1 is driven to a read voltage VREAD at step 502, and repeatedly pulsed until after time t1, as shown in FIG. 10B. The pulse duration, meaning the amount of time WL1 is held at VREAD, can be determined by a clock frequency. The pulse spacing, meaning the amount of time separating pulses, can also be determined by a clock frequency. These parameters of the pulses can be set based on design criteria, such as the process technology, the level of VREAD, and the read cycle time for example. This embodiment is referred to as a fixed width pulsed wordline scheme.

Further discussion of different pulse types is discussed later.

In response to a number of WL1 pulses, a small charge may be added to BL1 due to some tunneling current through cell 302. At about the same time at optional step 504, reference enable signal REF_EN rises to the high logic level to add a reference charge to the unselected bitline BL2. REF_EN can be a reference wordline connected to a reference cell, or REF_EN can be a control signal that enables a reference circuit to provide the charge. As shown in FIG. 10B, BL1/SL1 connected to cell 302 rises slightly above the VSS precharge level while BL2/SL2 rises to a reference level higher than BL1/SL1. Following at step 506, cell 302 is decoupled from sense amplifier 314 at time t1 by driving ISO to the low logic level to turn off isolation transistors 306 and 308. Decoupling is an optional feature which can be omitted from the method of FIG. 10A. It is noted that BL1 and SL1 remain at substantially the same voltage level, as do BL2 and SL2. Later at step 508 the sense amplifier 314 is activated (or enabled) by driving H_EN to the high logic level and L_EN to the low logic level at time t2. As previously described for the embodiment of FIGS. 8B and 8C, SL2 and SL1 are driven to high and low voltage levels respectively.

Figure 11:
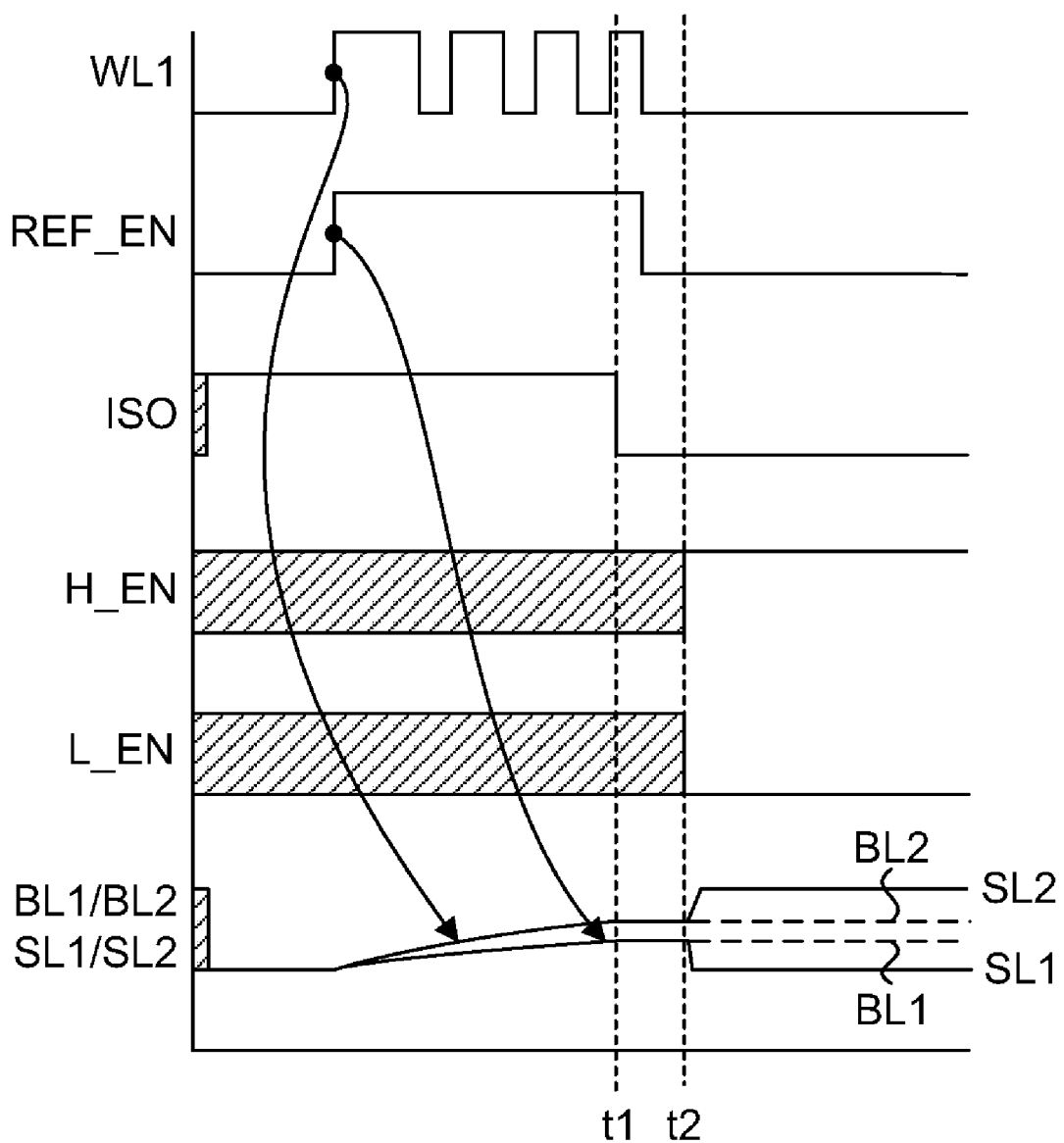
FIG. 11 is a sequence diagram showing an alternate pulsed wordline scheme, according to a present embodiment.

The pulsed wordline embodiment of FIG. 10B uses pulses of equal duration and magnitude. According to an alternate embodiment, the pulse widths can vary in size as shown in the sequence diagram of FIG. 11. The sequence diagram of FIG. 11 is identical to the sequence diagram shown in FIG. 10B, except that the pulse characteristics of WL1 differ from those of WL1 in FIG. 10B. In the alternate embodiment of FIG. 11, the pulse widths of WL1 gradually decrease in size (duration) over time. The longer pulses are used during the initial activation of the selected wordline WL1 to quickly charge bitlines connected to programmed cells. When the time to activate the sense amplifiers approaches, the pulse widths should be at their minimum size. For programmed cells, the corresponding bitlines should be sufficiently high to sense relative to the reference level. For unprogrammed cells, the smaller pulse widths further reduce the duration of time VREAD is applied. This embodiment is referred to as a variable width pulsed wordline scheme.

The pulsed wordline embodiments of FIGS. 10B and 11 use pulses having full rail-to-rail swing, meaning that each pulse rises to the maximum VREAD level, and then falls to the VSS level. According to an alternate embodiment shown in FIG. 12, all pulses between the first pulse and the last pulse fall to an intermediate voltage level that is above VSS. The first pulse rises from VSS, but subsequent pulses fall and rise from the intermediate voltage level. Only the last pulse falls back to VSS. Thus, WL1 resembles a single static pulse having an AC component. This embodiment is referred to as a partial pulsed wordline scheme, where the pulse width is constant. This is a variant of the fixed width pulsed wordline scheme where the wordline driver is provided with an intermediate voltage above VSS, instead of VSS. The advantage of the partial pulsed wordline scheme is that the lower voltage level of the wordline WL should be sufficient to charge the corresponding bitline, while the AC component peaks will drive any weakly programmed cells. The unprogrammed cells are not exposed to a continuous VREAD voltage.

Figure 12:
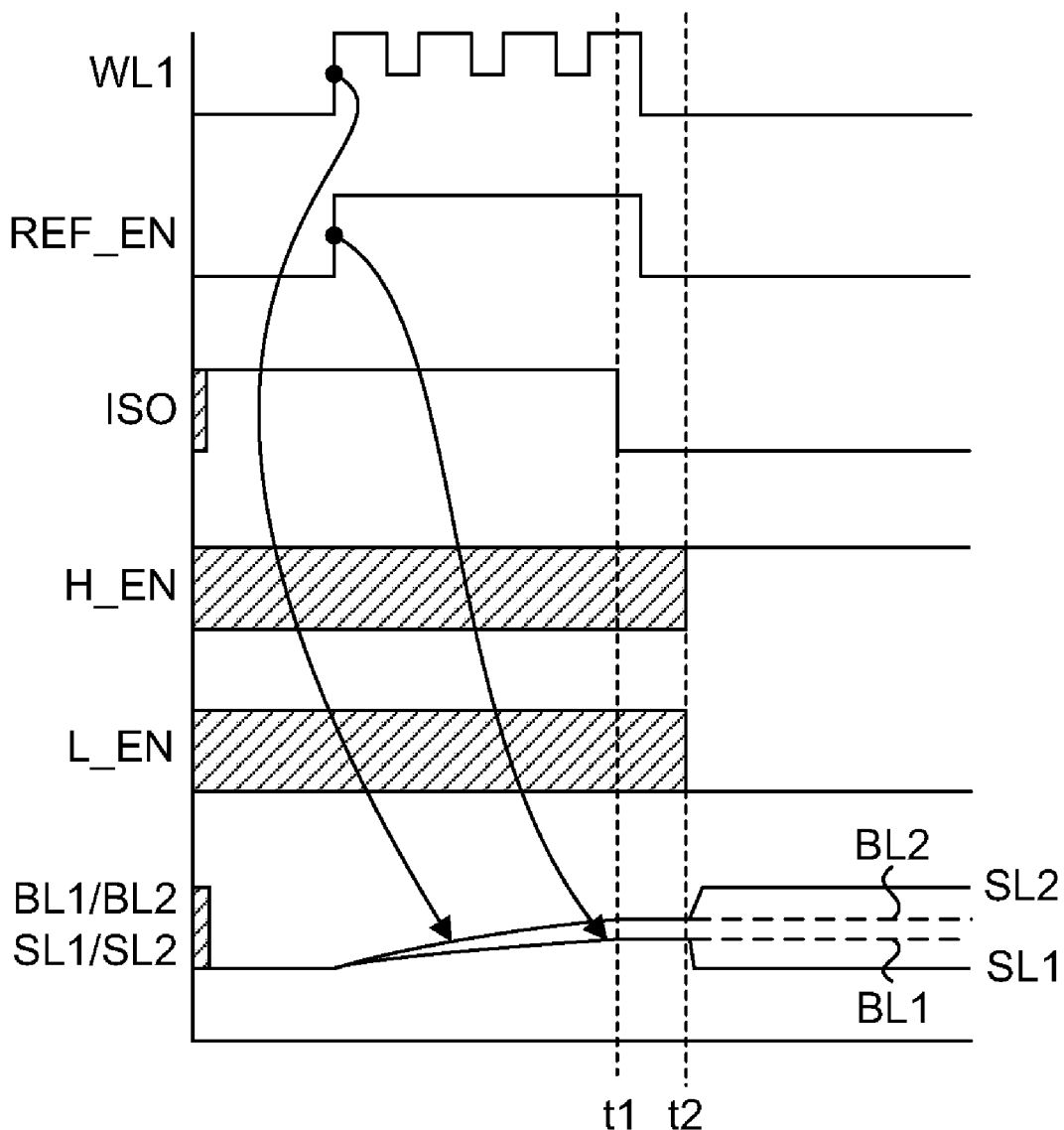
FIG. 12 is a sequence diagram showing another alternate pulsed wordline scheme, according to a present embodiment.

Further alternate embodiments can include variable magnitude pulses, where the initial wordline pulse reaches the maximum VREAD level, followed by successive pulses with lower pulse heights. All the described and shown wordline pulsing schemes can be combined with each other to form different types of wordline pulses that are effective for minimizing the exposure of the unprogrammed cells to VREAD, while ensuring that programmed cells can charge their respective bitlines to a level high enough for sensing relative to a reference level or the level of an unprogrammed cell for differential read modes of operation. The sequence diagrams of FIGS. 10B, 11 and 12 are shown with respect to a read operation executed by the memory array 300 of FIG. 8B. These sequence diagrams equally apply to a read operation executed by the memory array 400 of FIG. 9A, except that the signal trace for signal PG1 is identical to that of ISO.

Figure 13:
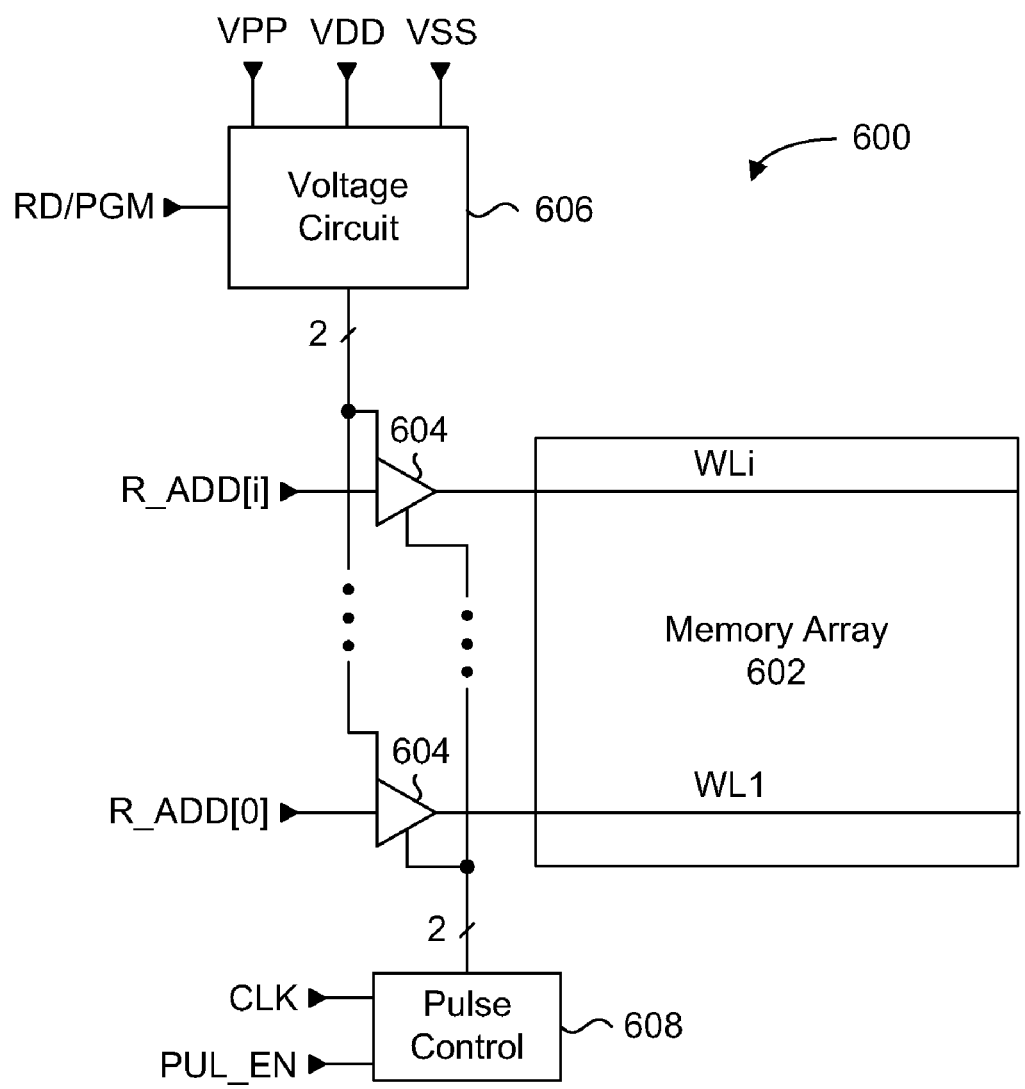
FIG. 13 is a block diagram of a pulsed wordline memory, according to a present embodiment; and, FIG. 14 is a circuit schematic example of a controlled wordline driver, according to a present embodiment.

The pulsing of the wordlines according to the previously described embodiments can be controlled by controlling wordline drivers, voltage generators, or a combination of the wordline drivers and the voltage generators. FIG. 13 is a block diagram of a pulsed wordline memory, according to a present embodiment.

The pulsed wordline memory 600 of FIG. 13 includes an anti-fuse memory array 602 having anti-fuse memory cells connected to bitlines (not shown) and wordlines, such as wordlines WL1 to WLi, where i is an integer value corresponding to the last wordline in the memory array 602. The arrangement of the anti-fuse memory cells, wordlines, bitlines and other related circuits can correspond to that previously shown in FIG. 8B or 9A. In the example of FIG. 13, the anti-fuse memory cells are of the single-transistor type shown in FIGS. 4A to 4C. The wordlines are driven by respective wordline drivers 604 to provide at least the read voltage VREAD and programming voltage VPP. Other voltages can be driven onto the wordlines by wordline drivers 604. The wordline drivers 604 are enabled by a decoded row address signals R_ADD[0] to R_ADD[i], where i is the same previously described integer value. Row address decoding is well known in the art, and it should be understood that during a read or program operation, one of R_ADD[0] to R_ADD[i] is driven to an active logic level to enable its corresponding wordline driver 604. The exception to this decoding scheme is when two wordlines are enabled at the same time for the differential read mode of operation.

A voltage circuit 606 provides VPP, VREAD, VSS and other possible voltages to the wordline drivers 604, which is driven onto the wordline when the specific wordline driver 604 is selected. Voltage circuit 606 can receive voltages such as VDD, VPP and VSS directly from voltage supplies externally provided to the memory 600. Alternately, voltage circuit 606 can include voltage pumps and generators that are well known in the art, for generating the VPP voltage, and any other intermediate voltages. Such an intermediate voltage can be used for the wordline pulsing scheme of FIG. 12. A read/program control signal RD/PGM is received to control voltage circuit 606 to selectively provide the proper voltages during read and program operations. Voltage circuit 606 outputs a high voltage and a low voltage to each of the wordline drivers 604. A pulse control circuit 608 provides pulsing signals for enabling and disabling the wordline drivers 604 in a sequence or pattern that results in any one of the previously described wordline pulsing schemes. For example, if the wordline drivers 604 are enabled and disabled at fixed intervals, then fixed width pulses will result. Alternately, if the wordline drivers 604 are enabled and disabled at variable intervals, then variable width pulses will result.

Only the wordline driver enabled by a decoded row address signal responds to these enabling signals. The pulse control circuit receives a pulse enable signal PUL_EN to enable generation of the pulsing signals during read operations. Pulse enable signal PUL_EN can be derived from the read/program signal RD/PGM. The pulsing signals can be generated in response to a clock signal, and the pulse control circuit 608 can include different types of circuits for generating the previously shown pulsing schemes. For example, well known clock dividing or multiplying circuits can be included for generating pulses of different widths for the embodiment of FIG. 10B. In another example, circuits which can change a duty cycle of a clock signal can be used to generate pulses of decreasing width for the embodiment of FIG. 11. A variety of circuits exist that can be adapted for the present application.

Figure 14:
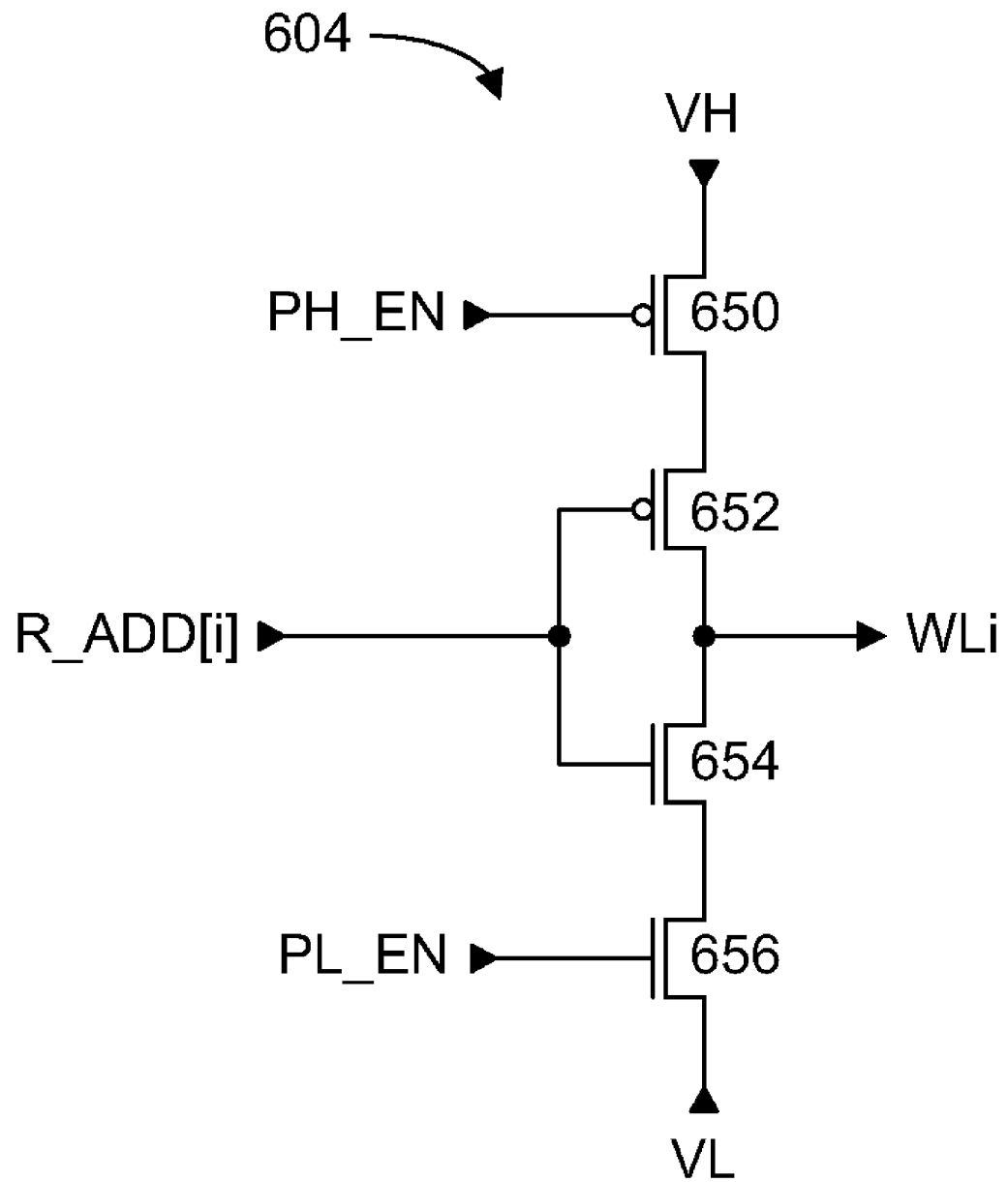

FIG. 14 is a circuit schematic example of a wordline driver circuit 604 shown in FIG. 13. Wordline driver 604 is shown as a controlled inverter circuit having p-type transistors 650, 652 and n-type transistors 654, 656 connected in series between a high voltage input VH and a low voltage input VL. High voltage VH is one of the two voltages received from voltage circuit 606 of FIG. 13, while low voltage VL is the other of the two voltages received from voltage circuit 606. The gate of transistor 650 receives high pulsing signal PH_EN and the gate of transistor 656 receives low pulsing signal PL_EN, both of which are the pulsing signals provided by pulse control circuit 608. Transistors 652 and 654 form a complementary pair, and their gates receive a decoded row address signal R_ADD[n]. The wordline driver circuit shown in FIG. 14 is one example of many different circuit configurations which can be used.

In a read operation, VH and VL are provided to the wordline driver 604, which is selected when R_ADD[i] is driven to the active logic level. Then PH_EN and PL_EN are driven between the active and inactive logic levels in a sequence or pattern. Hence VH and VL are applied to the wordline WLi. The frequency and duration of the active and inactive levels of PH_EN and PL_EN determine the pulse widths. VH and VL can change during the read operation to change the maximum pulse height and the minimum pulse floor.

The previously described embodiments illustrate techniques for maximizing retention of unprogrammed anti-fuse memory cells. The wordlines can be pulsed to minimize the exposure of the gate oxides of unprogrammed cells to the read voltage, and the cells can be decoupled from sense amplifiers prior to being enabled. Both techniques can reduce the amount of tunneling current through the gate oxide of the unprogrammed cells, while reducing power consumption.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

Embodiments of the invention can be represented as a software product stored in a machine-readable medium (also referred to as a computer-readable medium, a processor-readable medium, or a computer usable medium having a computer-readable program code embodied therein). The machine-readable medium can be any suitable tangible medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the invention. Those of ordinary skill in the art will appreciate that other instructions and operations necessary to implement the described invention can also be stored on the machine-readable medium. Software running from the machine-readable medium can interface with circuitry to perform the described tasks.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A method for reading programmed and unprogrammed anti-fuse memory cells comprising:
   i) driving a selected wordline connected to an anti-fuse device of an anti-fuse memory cell to a read voltage;
   ii) charging a bitline electrically coupled to the anti-fuse device in response to the selected wordline at the read voltage;
   iii) decoupling the anti-fuse device from the bitline; and
   iv) enabling a sense amplifier to sense a voltage level of the bitline.

2. The method of claim 1, further including precharging the bitline and a reference bitline to a first voltage supply prior to driving the selected wordline.

3. The method of claim 2, wherein charging includes adding a reference charge to the reference bitline.

4. The method of claim 2, wherein driving includes driving the bitline to one of the first voltage supply and a second voltage supply, and driving the reference bitline to the other of the first voltage supply and the second voltage supply.

5. The method of claim 1, wherein decoupling includes decoupling the bitline from a sense node of the sense amplifier.

6. The method of claim 5, wherein decoupling the bitline includes turning off an isolation transistor between the bitline and the sense node of the sense amplifier.

7. The method of claim 6, wherein the selected wordline is disabled after decoupling.

8. The method of claim 1, wherein the anti-fuse memory cell includes an access transistor connected between the bitline and the anti-fuse device, and decoupling includes turning off the access transistor.

9. The method of claim 1, wherein driving includes pulsing the selected wordline with a wordline pulsing scheme.

10. The method of claim 9, wherein the wordline pulsing scheme includes a single pulse.

11. The method of claim 9, wherein the wordline pulsing scheme includes wordline pulses having fixed width pulses.

12. The method of claim 9, wherein the wordline pulsing scheme includes wordline pulses having variable width pulses.

13. The method of claim 9, wherein the wordline pulsing scheme includes wordline pulses having partial pulses.

14. The method of claim 9, wherein pulsing of the wordline ends after decoupling.

15. A method for reading programmed and unprogrammed anti-fuse memory cells comprising:
   i) pulsing a selected wordline connected to an anti-fuse device of an anti-fuse memory cell between a first voltage and a second voltage;
   ii) charging a bitline electrically coupled to the anti-fuse device in response to the selected wordline being pulsed; and,
   iii) enabling a sense amplifier to sense a voltage level of the bitline.

16. The method of claim 15, wherein the selected wordline has pulses with fixed widths.

17. The method of claim 15, wherein the selected wordline has pulses with variable widths.

18. The method of claim 15, wherein the selected wordline has pulses that rise to the first voltage and fall to a third voltage between the first voltage and the second voltage.

19. The method of claim 15, further including decoupling the anti-fuse device before sensing.

20. The method of claim 19, wherein pulsing of the wordline ends after decoupling.

21. The method of claim 19, wherein decoupling includes decoupling the bitline from a sense node of the sense amplifier.

22. The method of claim 19, wherein the anti-fuse memory cell includes an access transistor connected between the bitline and the anti-fuse device, and decoupling includes turning off the access transistor.

23. An anti-fuse memory comprising:
   anti-fuse memory cells connected to wordlines and bitlines;
   wordline drivers for driving the wordlines with at least one voltage level;
   a voltage circuit for providing the at least one voltage level; and,
   a pulse control circuit for enabling and disabling the wordline drivers in a read operation to provide the at least one voltage level in accordance with a pulsing scheme.

24. The anti-fuse memory of claim 23, wherein the pulse control circuit enables and disables the wordline drivers at fixed intervals to provide pulses of a fixed width.

25. The anti-fuse memory of claim 24, wherein the voltage circuit provides an intermediate voltage, and the wordline drivers are disabled to provide the intermediate voltage, the intermediate voltage being greater than VSS.

26. The anti-fuse memory of claim 23, wherein the pulse control circuit enables and disables the wordline drivers at variable intervals to provide pulses of a variable width.

* * * * *